United States Patent
Kumar et al.

(10) Patent No.: US 10,526,701 B2
(45) Date of Patent: Jan. 7, 2020

(54) MULTI-CYCLE ALD PROCESS FOR FILM UNIFORMITY AND THICKNESS PROFILE MODULATION

(71) Applicant: Lam Research Corporation, Fremont, CA (US)

(72) Inventors: Purushottam Kumar, Hillsboro, OR (US); Adrien LaVoie, Newberg, OR (US); Hu Kang, Tualatin, OR (US); Jun Qian, Sherwood, OR (US); Tuan Nguyen, Beaverton, OR (US); Ye Wang, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/814,372

(22) Filed: Jul. 30, 2015

(65) Prior Publication Data

US 2017/0009346 A1 Jan. 12, 2017

Related U.S. Application Data

(60) Provisional application No. 62/190,618, filed on Jul. 9, 2015.

(51) Int. Cl.
C23C 16/50 (2006.01)
C23C 16/455 (2006.01)

(52) U.S. Cl.
CPC .. C23C 16/45542 (2013.01); *C23C 16/45527* (2013.01); *C23C 16/45536* (2013.01)

(58) Field of Classification Search
CPC ........ C23C 16/45525; C23C 16/45542; C23C 16/45527; C23C 16/45536

(Continued)

(56) References Cited

U.S. PATENT DOCUMENTS 4,500,563 A  2/1985 Ellenberger et al.
5,223,443 A  6/1993 Chinn et al.
(Continued)

FOREIGN PATENT DOCUMENTS

EP  0 277 766  8/1988
EP  0 541 212  5/1993
(Continued)

OTHER PUBLICATIONS

U.S. Appl. No. 14/607,997, filed Jan. 28, 2015, entitled "Plasma Activated Conformal Dielectric Film Deposition".

(Continued)

*Primary Examiner* — Katherine A Bareford
*Assistant Examiner* — Christina D McClure
(74) *Attorney, Agent, or Firm* — Weaver Austin Villeneuve & Sampson LLP

(57) ABSTRACT

Methods of depositing uniform films on substrates using multi-cyclic atomic layer deposition techniques are described. Methods involve varying one or more parameter values from cycle to cycle to tailor the deposition profile. For example, some methods involve repeating a first ALD cycle using a first carrier gas flow rate during precursor exposure and a second ALD cycle using a second carrier gas flow rate during precursor exposure. Some methods involve repeating a first ALD cycle using a first duration of precursor exposure and a second ALD cycle using a second duration of precursor exposure.

9 Claims, 15 Drawing Sheets

(58) Field of Classification Search
USPC .................................................... 427/569
See application file for complete search history.

(56) References Cited

U.S. PATENT DOCUMENTS

| | | | |
|---|---|---|---|
| 5,496,608 | A | 3/1996 | Matsuda et al. |
| 5,593,914 | A | 1/1997 | Evans, Jr. et al. |
| 5,670,432 | A | 9/1997 | Tsai |
| 5,856,003 | A | 1/1999 | Chiu |
| 5,874,368 | A | 2/1999 | Laxman et al. |
| 5,932,286 | A | 8/1999 | Beinglass et al. |
| 6,270,572 | B1 | 8/2001 | Kim et al. |
| 6,346,741 | B1 | 2/2002 | Van Buskirk et al. |
| 6,391,803 | B1 | 5/2002 | Kim et al. |
| 6,416,822 | B1 | 7/2002 | Chiang et al. |
| 6,428,859 | B1 | 8/2002 | Chiang et al. |
| 6,468,924 | B2 | 10/2002 | Lee et al. |
| 6,509,601 | B1 | 1/2003 | Lee et al. |
| 6,528,430 | B2 | 3/2003 | Kwan et al. |
| 6,551,893 | B1 | 4/2003 | Zheng et al. |
| 6,576,053 | B1 | 6/2003 | Kim et al. |
| 6,632,478 | B2 | 10/2003 | Gaillard et al. |
| 6,645,574 | B1 | 11/2003 | Lee et al. |
| 6,689,220 | B1 | 2/2004 | Nguyen |
| 6,723,595 | B2 | 4/2004 | Park |
| 6,730,614 | B1 | 5/2004 | Lim et al. |
| 6,743,738 | B2 | 6/2004 | Todd |
| 6,756,318 | B2 | 6/2004 | Nguyen et al. |
| 6,809,421 | B1 | 10/2004 | Hayasaka et al. |
| 6,828,218 | B2 | 12/2004 | Kim et al. |
| 6,835,417 | B2 | 12/2004 | Saenger et al. |
| 6,861,356 | B2 | 3/2005 | Matsuse et al. |
| 6,884,466 | B2 | 4/2005 | Kaloyeros et al. |
| 6,930,058 | B2 | 8/2005 | Hill et al. |
| 6,930,060 | B2 | 8/2005 | Chou et al. |
| 6,943,092 | B2 | 9/2005 | Kim et al. |
| 6,962,876 | B2 | 11/2005 | Ahn et al. |
| 6,987,240 | B2 | 1/2006 | Jennings et al. |
| 7,001,844 | B2 | 2/2006 | Chakravarti et al. |
| 7,041,335 | B2 | 5/2006 | Chung |
| 7,077,904 | B2 | 7/2006 | Cho et al. |
| 7,081,271 | B2 | 7/2006 | Chung et al. |
| 7,109,129 | B1 | 9/2006 | Papasouliotis |
| 7,115,528 | B2 | 10/2006 | Vaartstra et al. |
| 7,122,222 | B2 | 10/2006 | Xiao et al. |
| 7,122,464 | B2 | 10/2006 | Vaarstra |
| 7,125,815 | B2 | 10/2006 | Vaartstra |
| 7,132,353 | B1 | 11/2006 | Xia et al. |
| 7,141,278 | B2 | 11/2006 | Koh et al. |
| 7,148,155 | B1 | 12/2006 | Tarafdar et al. |
| 7,151,039 | B2 | 12/2006 | Lee et al. |
| 7,172,792 | B2 | 2/2007 | Wang et al. |
| 7,176,084 | B2 | 2/2007 | Lee et al. |
| 7,205,187 | B2 | 4/2007 | Leith et al. |
| 7,223,649 | B2 | 5/2007 | Oh et al. |
| 7,241,686 | B2 | 7/2007 | Marcadal et al. |
| 7,244,668 | B2 | 7/2007 | Kim |
| 7,250,083 | B2 | 7/2007 | Sneh |
| 7,259,050 | B2 | 8/2007 | Chen et al. |
| 7,261,919 | B2 | 8/2007 | Mehregany et al. |
| 7,294,582 | B2 | 11/2007 | Haverkort et al. |
| 7,297,641 | B2 | 11/2007 | Todd et al. |
| 7,300,885 | B2 | 11/2007 | Hasebe et al. |
| 7,314,835 | B2 | 1/2008 | Ishizaka et al. |
| 7,341,959 | B2 | 3/2008 | Brcka |
| 7,351,668 | B2 | 4/2008 | Chou et al. |
| 7,361,538 | B2 | 4/2008 | Luan et al. |
| 7,361,611 | B2 | 4/2008 | Chakravarti et al. |
| 7,390,743 | B2 | 6/2008 | Shin |
| 7,393,561 | B2 | 7/2008 | Paranjpe |
| 7,399,388 | B2 | 7/2008 | Moghadam et al. |
| 7,419,888 | B2 | 9/2008 | Yang et al. |
| 7,435,454 | B2 | 10/2008 | Brcka |
| 7,435,684 | B1 | 10/2008 | Lang et al. |
| 7,462,571 | B2 | 12/2008 | Hasebe et al. |
| 7,482,247 | B1 | 1/2009 | Papasouliotis et al. |
| 7,488,694 | B2 | 2/2009 | Kim et al. |
| 7,507,676 | B2 | 3/2009 | Chou et al. |
| 7,510,984 | B2 | 3/2009 | Saito et al. |
| 7,521,331 | B2 | 4/2009 | Park et al. |
| 7,524,762 | B2 | 4/2009 | Marcadal et al. |
| 7,544,615 | B2 | 6/2009 | Vaartstra |
| 7,572,052 | B2 | 8/2009 | Ravi et al. |
| 7,592,231 | B2 | 9/2009 | Cheng et al. |
| 7,595,010 | B2 | 9/2009 | Chakravarti et al. |
| 7,601,648 | B2 | 10/2009 | Chua et al. |
| 7,615,438 | B2 | 11/2009 | Ahn et al. |
| 7,615,449 | B2 | 11/2009 | Chung et al. |
| 7,622,369 | B1 | 11/2009 | Lee et al. |
| 7,622,383 | B2 | 11/2009 | Kim et al. |
| 7,629,267 | B2 | 12/2009 | Wan et al. |
| 7,632,757 | B2 | 12/2009 | Matsuura |
| 7,633,125 | B2 | 12/2009 | Lu et al. |
| 7,638,170 | B2 | 12/2009 | Li |
| 7,645,484 | B2 | 1/2010 | Ishizaka |
| 7,651,729 | B2 | 1/2010 | Kim et al. |
| 7,651,730 | B2 | 1/2010 | Hasebe |
| 7,651,953 | B2 | 1/2010 | Todd et al. |
| 7,651,959 | B2 | 1/2010 | Fukazawa et al. |
| 7,682,657 | B2 | 3/2010 | Sherman |
| 7,687,409 | B2 | 3/2010 | Ahn et al. |
| 7,713,592 | B2 | 5/2010 | Nguyen et al. |
| 7,758,920 | B2 | 7/2010 | Hasebe et al. |
| 7,776,733 | B2 | 8/2010 | Hasegawa |
| 7,825,039 | B2 | 11/2010 | Takahashi et al. |
| 7,906,168 | B2 | 3/2011 | Hasebe et al. |
| 7,919,416 | B2 | 4/2011 | Lee et al. |
| 7,923,068 | B2 | 4/2011 | Dickey et al. |
| 7,923,378 | B2 | 4/2011 | Hasebe et al. |
| 7,959,985 | B2 | 6/2011 | Ishizaka et al. |
| 7,964,241 | B2 | 6/2011 | Hasebe et al. |
| 7,964,513 | B2 | 6/2011 | Todd et al. |
| 7,981,473 | B2 | 7/2011 | Kim et al. |
| 7,989,365 | B2 | 8/2011 | Park et al. |
| 8,034,673 | B2 | 10/2011 | Kadonaga et al. |
| 8,080,290 | B2 | 12/2011 | Hasebe et al. |
| 8,101,531 | B1 | 1/2012 | Li et al. |
| 8,119,424 | B2 | 2/2012 | Mather et al. |
| 8,119,544 | B2 | 2/2012 | Hasebe et al. |
| 8,133,797 | B2 | 3/2012 | van Schravendijk et al. |
| 8,178,448 | B2 | 5/2012 | Nodera et al. |
| 8,227,032 | B2 | 7/2012 | Dussarrat et al. |
| 8,257,789 | B2 | 9/2012 | Matsunaga et al. |
| 8,278,224 | B1 | 10/2012 | Mui et al. |
| 8,334,218 | B2 | 12/2012 | Van Nooten et al. |
| 8,357,619 | B2 | 1/2013 | Hasebe et al. |
| 8,366,953 | B2 | 2/2013 | Kohno et al. |
| 8,383,525 | B2 | 2/2013 | Raisanen et al. |
| 8,394,466 | B2 | 3/2013 | Hong et al. |
| 8,524,612 | B2 | 9/2013 | Li et al. |
| 8,592,328 | B2 | 11/2013 | Hausmann et al. |
| 8,637,411 | B2 | 1/2014 | Swaminathan et al. |
| 8,647,993 | B2 | 2/2014 | Lavoie et al. |
| 8,669,185 | B2 | 3/2014 | Onizawa et al. |
| 8,728,956 | B2 | 5/2014 | LaVoie et al. |
| 8,956,983 | B2 | 2/2015 | Swaminathan et al. |
| 8,999,859 | B2 | 4/2015 | Swaminathan et al. |
| 9,076,646 | B2 | 7/2015 | Sims et al. |
| 2002/0076507 | A1 | 6/2002 | Chiang et al. |
| 2003/0008070 | A1 | 1/2003 | Seutter et al. |
| 2003/0024477 | A1 | 2/2003 | Okuda et al. |
| 2003/0200917 | A1 | 10/2003 | Vaartstra |
| 2004/0033698 | A1 | 2/2004 | Lee et al. |
| 2004/0043633 | A1 | 3/2004 | Vaartstra |
| 2004/0053515 | A1 | 3/2004 | Comita et al. |
| 2004/0121164 | A1 | 6/2004 | Iacovangelo et al. |
| 2004/0219746 | A1 | 11/2004 | Vaartstra et al. |
| 2004/0231799 | A1 | 11/2004 | Lee et al. |
| 2005/0042865 | A1 | 2/2005 | Cabral et al. |
| 2005/0109276 | A1 | 5/2005 | Iyer et al. |
| 2005/0118837 | A1 | 6/2005 | Todd et al. |
| 2005/0159017 | A1 | 7/2005 | Kim et al. |
| 2005/0181535 | A1 | 8/2005 | Yun et al. |
| 2005/0196977 | A1 | 9/2005 | Saito et al. |

(56) References Cited

U.S. PATENT DOCUMENTS

| | | | |
|---|---|---|---|
| 2005/0233553 A1 | 10/2005 | Kountz et al. | |
| 2005/0260347 A1 | 11/2005 | Narwankar et al. | |
| 2005/0276099 A1 | 12/2005 | Horng et al. | |
| 2005/0287775 A1 | 12/2005 | Hasebe et al. | |
| 2006/0030148 A1 | 2/2006 | Seutter et al. | |
| 2006/0084283 A1 | 4/2006 | Paranjpe et al. | |
| 2006/0088985 A1 | 4/2006 | Haverkort et al. | |
| 2006/0093756 A1* | 5/2006 | Rajagopalan ....... C23C 16/4404 427/569 | |
| 2006/0165890 A1 | 7/2006 | Kaushal et al. | |
| 2006/0199357 A1 | 9/2006 | Wan et al. | |
| 2006/0228868 A1 | 10/2006 | Ahn et al. | |
| 2006/0286774 A1 | 12/2006 | Singh et al. | |
| 2006/0286776 A1 | 12/2006 | Ranish et al. | |
| 2006/0286818 A1 | 12/2006 | Wang et al. | |
| 2007/0010071 A1 | 1/2007 | Matsuura | |
| 2007/0042577 A1* | 2/2007 | Ishizaka ............ C23C 16/45529 438/503 | |
| 2007/0065576 A1 | 3/2007 | Singh et al. | |
| 2007/0134942 A1 | 6/2007 | Ahn et al. | |
| 2007/0137572 A1 | 6/2007 | Matsuura et al. | |
| 2007/0167028 A1 | 7/2007 | Chou et al. | |
| 2007/0215036 A1 | 9/2007 | Park et al. | |
| 2007/0218701 A1 | 9/2007 | Shimizu et al. | |
| 2007/0232082 A1 | 10/2007 | Balseanu et al. | |
| 2007/0251444 A1 | 11/2007 | Gros-Jean et al. | |
| 2007/0259110 A1 | 11/2007 | Mahajani et al. | |
| 2008/0038936 A1 | 2/2008 | Todd et al. | |
| 2008/0063791 A1 | 3/2008 | Hasebe et al. | |
| 2008/0075881 A1 | 3/2008 | Won et al. | |
| 2008/0087890 A1 | 4/2008 | Ahn et al. | |
| 2008/0123394 A1 | 5/2008 | Lee et al. | |
| 2008/0131601 A1 | 6/2008 | Kim et al. | |
| 2008/0139003 A1 | 6/2008 | Pirzada et al. | |
| 2008/0213479 A1 | 9/2008 | Chou et al. | |
| 2008/0242116 A1 | 10/2008 | Clark | |
| 2008/0274302 A1 | 11/2008 | Hasebe et al. | |
| 2008/0311760 A1 | 12/2008 | Nodera et al. | |
| 2008/0317972 A1 | 12/2008 | Hendriks et al. | |
| 2009/0018668 A1 | 1/2009 | Galbraith | |
| 2009/0039349 A1 | 2/2009 | Honda | |
| 2009/0041952 A1 | 2/2009 | Yoon et al. | |
| 2009/0065896 A1 | 3/2009 | Hwang et al. | |
| 2009/0075490 A1 | 3/2009 | Dussarrat | |
| 2009/0148625 A1 | 6/2009 | Yeom et al. | |
| 2009/0155606 A1 | 6/2009 | Yoon et al. | |
| 2009/0163012 A1 | 6/2009 | Clark et al. | |
| 2009/0191722 A1 | 7/2009 | Hasebe et al. | |
| 2009/0203197 A1 | 8/2009 | Hanawa et al. | |
| 2009/0208880 A1 | 8/2009 | Nemani et al. | |
| 2009/0278224 A1 | 11/2009 | Kim et al. | |
| 2010/0022099 A1 | 1/2010 | Van Nooten et al. | |
| 2010/0025824 A1 | 2/2010 | Chen et al. | |
| 2010/0096688 A1 | 4/2010 | Balseanu et al. | |
| 2010/0099236 A1 | 4/2010 | Kwon et al. | |
| 2010/0102417 A1 | 4/2010 | Ganguli et al. | |
| 2010/0124621 A1 | 5/2010 | Kobayashi et al. | |
| 2010/0136260 A1 | 6/2010 | Matsunaga et al. | |
| 2010/0136313 A1 | 6/2010 | Shimizu et al. | |
| 2010/0167555 A1 | 7/2010 | Maula et al. | |
| 2010/0221925 A1 | 9/2010 | Lee et al. | |
| 2010/0304574 A1 | 12/2010 | Nodera et al. | |
| 2010/0310791 A1 | 12/2010 | Shimazu et al. | |
| 2011/0003445 A1 | 1/2011 | Murata et al. | |
| 2011/0014795 A1 | 1/2011 | Lee et al. | |
| 2011/0014796 A1 | 1/2011 | Hayashi | |
| 2011/0014798 A1 | 1/2011 | Mallick et al. | |
| 2011/0064969 A1 | 3/2011 | Chen et al. | |
| 2011/0086516 A1 | 4/2011 | Lee et al. | |
| 2011/0139176 A1 | 6/2011 | Cheung et al. | |
| 2011/0143548 A1 | 6/2011 | Cheung et al. | |
| 2011/0151142 A1 | 6/2011 | Seamons et al. | |
| 2011/0151246 A1 | 6/2011 | Ramon Moreno et al. | |
| 2011/0151674 A1 | 6/2011 | Tang et al. | |
| 2011/0151678 A1 | 6/2011 | Ashtiani et al. | |
| 2011/0159202 A1 | 6/2011 | Matsushita et al. | |
| 2011/0198756 A1 | 8/2011 | Thenappan et al. | |
| 2011/0201210 A1 | 8/2011 | Sato et al. | |
| 2011/0215445 A1 | 9/2011 | Yang et al. | |
| 2011/0256726 A1* | 10/2011 | LaVoie ................. C23C 16/045 438/702 | |
| 2011/0256734 A1 | 10/2011 | Hausmann et al. | |
| 2011/0298099 A1 | 12/2011 | Lee et al. | |
| 2011/0309475 A1 | 12/2011 | Lee | |
| 2012/0009802 A1 | 1/2012 | LaVoie et al. | |
| 2012/0009803 A1 | 1/2012 | Jung et al. | |
| 2012/0028454 A1 | 2/2012 | Swaminathan et al. | |
| 2012/0028469 A1 | 2/2012 | Onizawa et al. | |
| 2012/0058282 A1 | 3/2012 | Hong et al. | |
| 2012/0077349 A1 | 3/2012 | Li et al. | |
| 2012/0108079 A1 | 5/2012 | Mahajani | |
| 2012/0113672 A1 | 5/2012 | Dubrow et al. | |
| 2012/0164846 A1 | 6/2012 | Ha et al. | |
| 2012/0193693 A1 | 8/2012 | Kanaya | |
| 2012/0213940 A1 | 8/2012 | Mallick | |
| 2012/0280200 A1 | 11/2012 | Tada et al. | |
| 2012/0282418 A1 | 11/2012 | Chou et al. | |
| 2012/0315394 A1 | 12/2012 | Ito | |
| 2013/0040447 A1 | 2/2013 | Swaminathan et al. | |
| 2013/0058161 A1 | 3/2013 | Yamanaka et al. | |
| 2013/0058162 A1 | 3/2013 | Yamanaka et al. | |
| 2013/0071580 A1 | 3/2013 | Weidman et al. | |
| 2013/0098455 A1* | 4/2013 | Ng ......................... C23C 16/303 137/1 | |
| 2013/0115763 A1* | 5/2013 | Takamure ........... H01L 21/02129 438/513 | |
| 2013/0115783 A1 | 5/2013 | Kim et al. | |
| 2013/0189854 A1 | 7/2013 | Hausmann et al. | |
| 2013/0196516 A1 | 8/2013 | Lavoie et al. | |
| 2013/0309415 A1 | 11/2013 | Swaminathan et al. | |
| 2013/0319329 A1 | 12/2013 | Li et al. | |
| 2014/0030444 A1 | 1/2014 | Swaminathan et al. | |
| 2014/0051262 A9 | 2/2014 | Lavoie et al. | |
| 2014/0106574 A1 | 4/2014 | Kang et al. | |
| 2014/0113457 A1* | 4/2014 | Sims ................. H01L 21/02167 438/792 | |
| 2014/0120737 A1* | 5/2014 | Swaminathan ... C23C 16/45527 438/765 | |
| 2014/0134827 A1 | 5/2014 | Swaminathan et al. | |
| 2014/0141542 A1 | 5/2014 | Kang et al. | |
| 2014/0141626 A1 | 5/2014 | Hausmann et al. | |
| 2014/0182619 A1 | 7/2014 | Goto et al. | |
| 2014/0209562 A1 | 7/2014 | LaVoie et al. | |
| 2014/0216337 A1 | 8/2014 | Swaminathan et al. | |
| 2014/0264555 A1 | 9/2014 | Ahn et al. | |
| 2014/0302686 A1 | 10/2014 | Pan et al. | |
| 2015/0109814 A1 | 4/2015 | Chen et al. | |
| 2015/0126042 A1 | 5/2015 | Pasquale et al. | |
| 2015/0147483 A1 | 5/2015 | Fukazawa | |
| 2015/0159271 A1 | 6/2015 | Lee et al. | |
| 2015/0170900 A1 | 6/2015 | LaVoie | |

FOREIGN PATENT DOCUMENTS

| | | | |
|---|---|---|---|
| EP | 1703552 A2 * | 9/2006 | ........... C23C 16/045 |
| EP | 2 278 046 | 1/2011 | |
| JP | 4364320 | 8/2009 | |
| JP | 2010-10497 | 1/2010 | |
| KR | 10-2001-0111448 | 12/2001 | |
| KR | 10-2004-0001036 | 1/2004 | |
| KR | 10-2009-0057665 | 6/2009 | |
| KR | 10-2009-0080019 | 7/2009 | |
| KR | 10-2009-0081396 | 7/2009 | |
| WO | WO 2006/026350 | 3/2006 | |
| WO | WO 2006/104741 | 10/2006 | |
| WO | WO 2007/118026 | 10/2007 | |
| WO | WO 2011/130326 | 10/2011 | |
| WO | WO 2011/130397 | 10/2011 | |
| WO | WO 2012/040317 | 3/2012 | |
| WO | WO 2012/048094 | 4/2012 | |
| WO | WO 2012/087737 | 6/2012 | |

(56) References Cited

FOREIGN PATENT DOCUMENTS

| WO | WO 2013/032786 | 3/2013 |
|---|---|---|
| WO | WO 2013/043330 | 3/2013 |
| WO | WO 2013/112727 | 8/2013 |

OTHER PUBLICATIONS

U.S. Appl. No. 14/194,549, filed Feb. 28, 2014, entitled "Capped ALD Films for Doping Fin-Shaped Channel Regions of 3-D IC Transistors."
U.S. Appl. No. 14/183,287, filed Feb. 18, 2014, entitled "High Growth Rate Process for Conformal Aluminum Nitride."
U.S. Appl. No. 14/187,145, filed Feb. 21, 2014, entitled "Plasma Assisted Atomic Layer Deposition Titanium Oxide for Conformal Encapsulation and Gap Fill Applications."
U.S. Appl. No. 14/335,785, filed Jul. 18, 2014, entitled "Methods for Depositing Silicon Oxide."
U.S. Appl. No. 14/552,011, filed Nov. 24, 2014, entitled "Selective Inhibition in Atomic Layer Deposition of Silicon-Containing Films."
U.S. Appl. No. 14/578,166, filed Dec. 19, 2014, entitled "Hardware and Process for Film Uniformity Improvement."
U.S. Appl. No. 14/678,736, filed Apr. 3, 2015, entitled "Deposition of Conformal Films by Atomic Layer Deposition and Atomic Layer Etch."
U.S. Office Action dated Mar. 15, 2013 issued in U.S. Appl. No. 13/084,399.
U.S. Final Office Action dated Sep. 13, 2013 issued in U.S. Appl. No. 13/084,399.
U.S. Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
U.S. Examiner's Answer to Appeal Brief (filed May 22, 2014) Before the Patent Trial and Appeal Board dated Aug. 14, 2014 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated May 15, 2015 issued in U.S. Appl. No. 14/074,617.
U.S. Office Action dated Mar. 2, 2015 issued in U.S. Appl. No. 14/137,860.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Jul. 2, 2015 issued in U.S. Appl. No. 14/187,145.
U.S. Office Action dated Apr. 13, 2015 issued in U.S. Appl. No. 14/335,785.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action [no translation] dated Jun. 2, 2015 issued in CN 201180045808.6.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Notice of Provisional Rejection dated Dec. 6, 2013 issued in KR 10-2012-0043797.
Korean Final Office Action dated Aug. 18, 2014 issued in KR 10-2012-0043797.
Korean Trial Decision (English description) dated May 25, 2015 issued in KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.

(56) References Cited

OTHER PUBLICATIONS

Cecchi et al., (2007) "Ultra-thin conformal pore-sealing of low-k materials by plasma-assisted ALD," *University of New Mexico, Albuquerque, NM, Sandia National Labs*, Albuquerque, NM, 1 page.

Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.

Hausmann et al. (2002) "Atomic Layer Deposition of Hafnium and Zirconium Oxides Using Metal Amide Precursors," *Chem. Mater.* 14(10):4350-4358.

Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.

King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).

Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].

Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.

Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.

Lee, Jong Ju, (2005) "Low-impurity, highly conformal atomic layer deposition of titanium nitride using $NH_3$-Ar-$H_2$ plasma treatment for capacitor electrodes," *Materials Letters*, 59:615-617.

Li, Xingcun, et al., (2011) "Atomic Layer Deposition $Al_2O_3$ Thin Films in Magnetized Radio Frequency Plasma Source," *Physics Procedia* 18:100-106.

Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.

Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.

Plasma Enhanced Atomic Layer Deposition (PEALD), Website: http://www.asm.com/index.php?option=com_content&task=view&id=19&Itemid=161 (2010), 1 page.

"PlasmaPro™ NGP® 80 Range," *Oxford Instruments* (2010), 8 pages.

Puurunen, Riikka L. (2005) "Surface chemistry of atomic layer deposition: A case study for the trimethylaluminum/water process," *Journal of Applied Physics*, 97:121301-1-121301-52.

Van der Straten et al. (2004) "Atomic layer deposition of tantalum nitride for ultrathin liner applications in advanced copper metallization schemes," *Journal of Materials Research*, 19(2):447-453.

\* cited by examiner

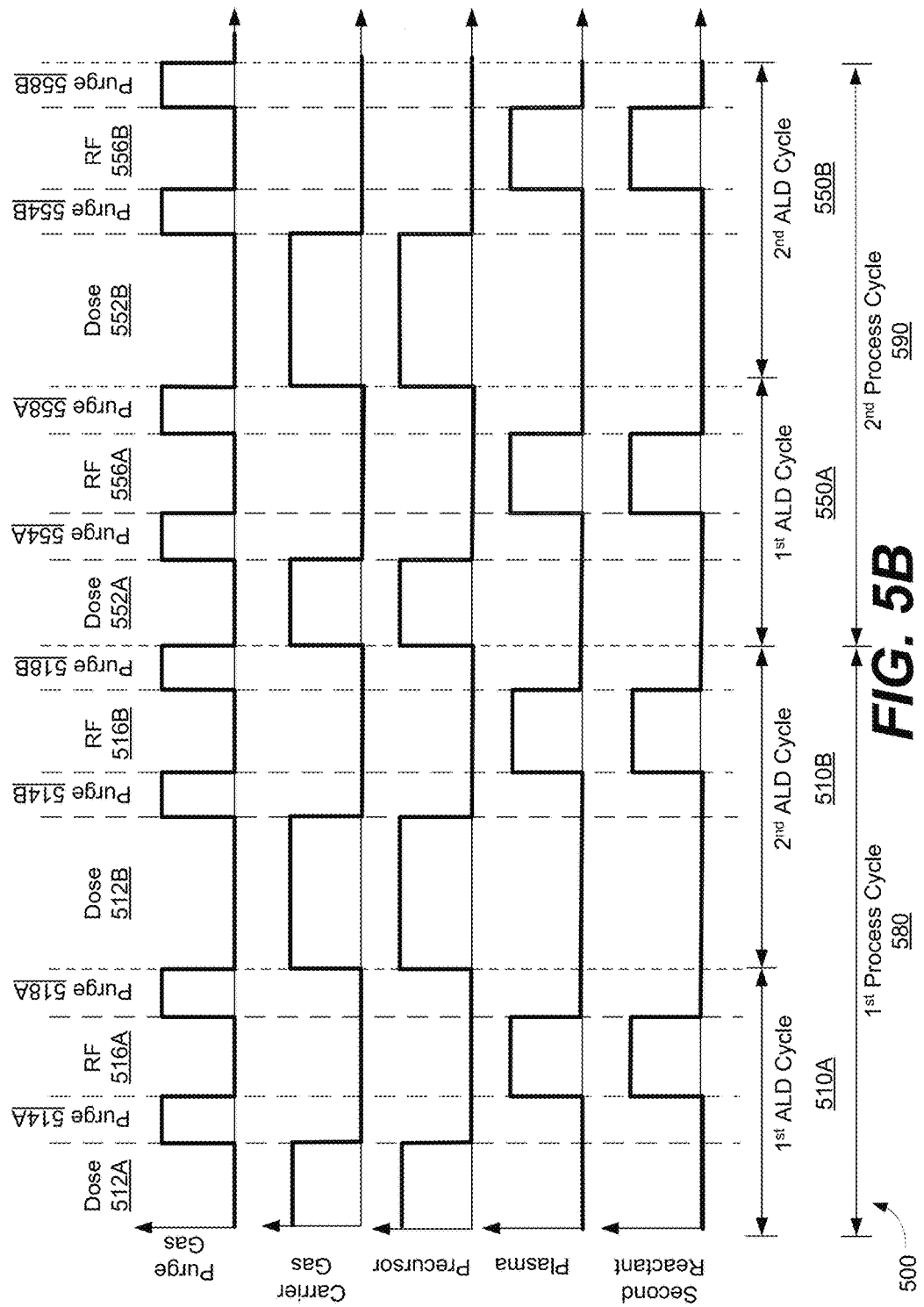

MULTI-CYCLE ALD PROCESS FOR FILM UNIFORMITY AND THICKNESS PROFILE MODULATION

CROSS-REFERENCE TO RELATED APPLICATION

This application claims benefit of U.S. Provisional Patent Application No. 62/190,618 filed Jul. 9, 2015, and titled "MULTI-CYCLE ALD PROCESS FOR FILM UNIFORMITY AND THICKNESS PROFILE MODULATION," which is incorporated by reference herein in its entirety and for all purposes.

BACKGROUND

Various thin film layers for semiconductor devices may be deposited with atomic layer deposition (ALD) processes. However, existing ALD processes may not be suitable for depositing highly conformal dielectric films. For example, many existing ALD processes cannot offer a combination of high throughput (rapid deposition) and high conformality.

SUMMARY

Provided herein are methods of processing substrates. One aspect involves a method of processing a substrate housed in a chamber by (a) exposing the substrate to a reactant for a duration insufficient to saturate the surface of the substrate; (b) exposing the substrate to a plasma to deposit at least a partial layer of film on the substrate; and (c) repeating (a) and (b) in two or more deposition cycles, whereby values of one or more parameters during at least one of (a) or (b) are varied during the two or more deposition cycles.

In various embodiments, one of the one or more parameters is the duration of (a). In various embodiments, one of the one or more parameters is a duration of (b). In some embodiments, the duration of (a) is greater than a duration of (b). In some embodiments, the duration of (a) is between about 0.05 second and about 5 seconds. In some embodiments, the duration of (a) is between about 0.1 second and about 1 second. In some embodiments, the duration of (b) is between about 0.05 second and about 5 seconds.

In some embodiments, one of the one or more parameters is carrier gas flow rate during (a). In some embodiments, one of the one or more parameters is process gas flow rate during (b). In some embodiments, the carrier gas flow rate during (a) may be between about 0.5 slm (standard liters per min) and about 20 slm. In some embodiments, the process gas flow rate during (b) may be between about 0.5 slm and about 20 slm.

In various embodiments, one of the one or more parameters is plasma power during (b). In some embodiments, the plasma power can be between about 50 W and about 6000 W.

In some embodiments, one of the one or more parameters is composition of the reactant in (a). In some embodiments, one of the one or more parameters is composition of carrier gases flowed during (a). In some embodiments, one of the one or more parameters is composition of process gases flowed during (b).

In some embodiments, exposing the substrate to the plasma in (b) further includes exposing the substrate to a second reactant. In some embodiments, one of the one or more parameters is composition of the second reactant.

The method may further include (d) purging the chamber after at least one of (a) or (b) one or more of the two or more deposition cycles. In some embodiments, purging the chamber includes flowing a purge gas. One of the one or more parameters may be duration of (d). In some embodiments, one of the one or more parameters is composition of the purge gas in (d).

Another aspect involves a method of processing a substrate housed in a chamber, the method including depositing a film by repeating two or more deposition cycles, whereby a deposition cycle includes: (a) exposing the substrate to a reactant, and (b) exposing the substrate to a plasma to deposit the film, whereby values of one or more parameters during one of (a) or (b) are varied from cycle to cycle in a process cycle.

In some embodiments, one of the one or more parameters is a duration of (a). In some embodiments, one of the one or more parameters is a duration of (b). In some embodiments, the duration of (a) is greater than a duration of (b). The duration of (a) may be between about 0.1 second and about 1 second. In some embodiments, the duration of (b) is between about 0.05 second and about 5 seconds.

In some embodiments, one of the one or more parameters is carrier gas flow rate during (a). In some embodiments, one of the one or more parameters is process gas flow rate during (b). In some embodiments, the carrier gas flow rate during (a) may be between about 0.5 slm (standard liters per min) and about 20 slm. In some embodiments, the process gas flow rate during (b) may be between about 0.5 slm and about 20 slm. In various embodiments, one of the one or more parameters is plasma power during (b). In some embodiments, the plasma power can be between about 50 W and about 6000 W. In some embodiments, one of the one or more parameters is composition of the reactant in (a).

The deposition cycle may further include (c) purging the chamber after at least one of (a) or (b) in one or more of the two or more deposition cycles. In some embodiments, purging the chamber includes flowing a purge gas. In some embodiments, one of the one or more parameters is duration of (c). In various embodiments, one of the one or more parameters is composition of the purge gas in (c).

In some embodiments, one of the one or more parameters is composition of carrier gases flowed during (a). In some embodiments, one of the one or more parameters is composition of process gases flowed during (b).

In some embodiments, exposing the substrate to the plasma further includes exposing the substrate to a second reactant. In some embodiments, the one or more parameters is composition of the second reactant.

Another aspect involves an apparatus for processing semiconductor substrates, the apparatus including: a. at least one process chamber including a pedestal for holding a substrate; b. at least one outlet for coupling to a vacuum; c. one or more process gas inlets coupled to one or more precursor sources; d. one or more process gas inlets coupled to one or more second reactant sources; and e. a controller for controlling operations in the apparatus, including machine readable instructions for: i. introducing one of the one or more precursor sources to the process chamber for a duration insufficient to saturate the surface of the substrate; ii. igniting a plasma to deposit at least a partial layer of film on the substrate; and iii. repeating (i) and (ii) in two or more deposition cycles and varying one or more parameter values during at least one of (i) or (ii) during the two or more deposition cycles.

In some embodiments, the machine readable instructions further include purging the at least one process chamber after introducing the one of the one or more precursor sources. In some embodiments, the machine readable instructions further include purging the at least one process chamber after igniting the plasma. In some embodiments, the plasma power can be between about 50 W and about 6000 W.

Another aspect involves an apparatus for processing semiconductor substrates, the apparatus including: a. at least one process chamber including a pedestal for holding a substrate; b. at least one outlet for coupling to a vacuum; c. one or more process gas inlets coupled to one or more precursor sources; d. one or more process gas inlets coupled to one or more second reactant sources; and e. a controller for controlling operations in the apparatus, including machine readable instructions for: i. introducing one of the one or more precursor sources to the process chamber with a carrier gas at a first carrier gas flow rate; ii. igniting a plasma to deposit a film; and iii. varying one or more parameter values during one of (i) or (ii) from cycle to cycle in a process cycle.

In some embodiments, the machine readable instructions further include purging the at least one process chamber after introducing the one of the one or more precursor sources. In some embodiments, the machine readable instructions further include purging the at least one process chamber after igniting the plasma. In some embodiments, the plasma power can be between about 50 W and about 6000 W.

These and other aspects are described further below with reference to the drawings.

BRIEF DESCRIPTION OF THE DRAWINGS

FIG. 5B is a timing sequence diagram showing an example of cycles in a method in accordance with disclosed embodiments.

DETAILED DESCRIPTION

Figure 1:
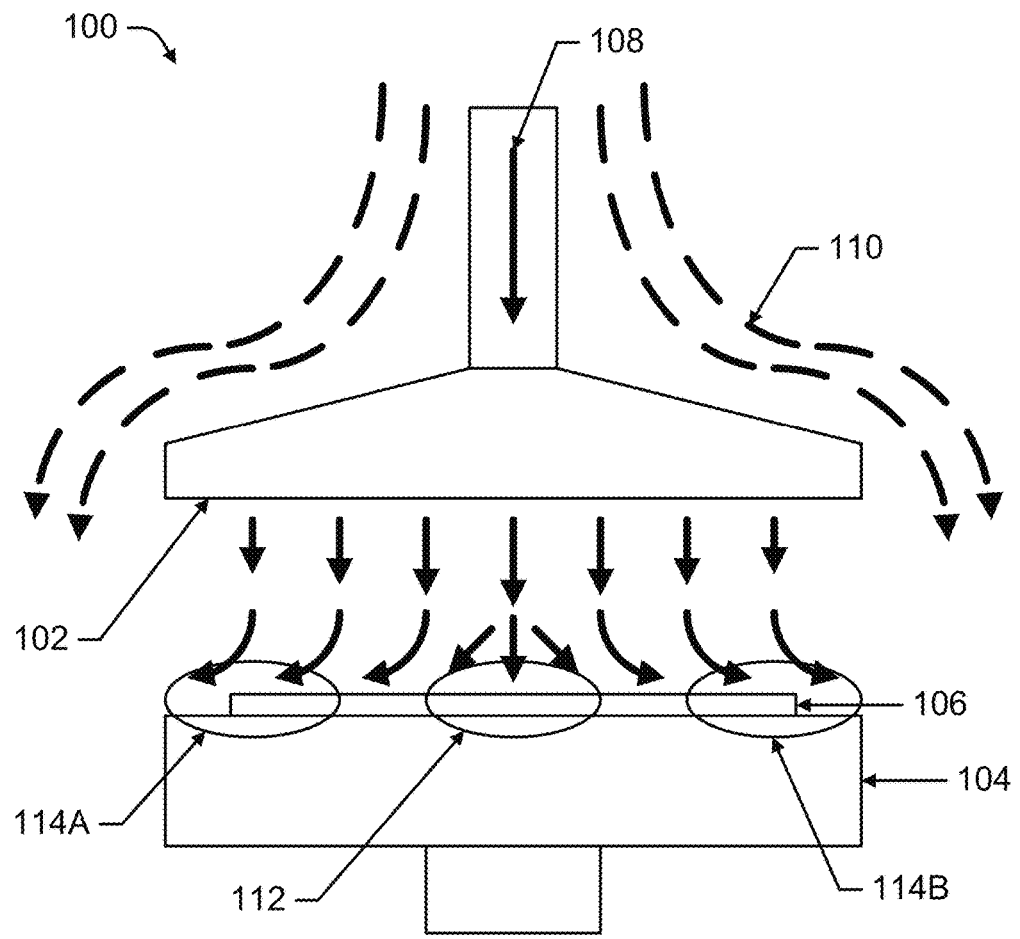
FIG. 1 is a schematic of a substrate process station illustrating precursor flow within a processing chamber during a deposition process.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes may involve deposition of various materials using atomic layer deposition (ALD). ALD processes use surface-mediated deposition reactions to deposit films on a layer-by-layer basis and often involve saturating a surface of a substrate with a precursor to deposit material in a self-limiting reaction. In one example of an ALD process, a substrate surface, including a population of surface active sites, is exposed to a gas phase distribution of a first reactant or precursor, such as a silicon-containing precursor, in a dose provided to a process station housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the reactor is then evacuated to remove any first precursor remaining in gas phase so that only the adsorbed species remain. A second reactant is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules and reaction by-products. Additional ALD cycles may be used to build film thickness. In some embodiments, only a single reactant is used and a thermal or plasma operation is used to convert adsorbed precursor to a desired deposition material.

In certain embodiments, an ALD precursor dose partially saturates the substrate surface. ALD processes performed in a sub-saturated regime may be referred to as sub-saturated ALD ("SS-ALD"). Films deposited by SS-ALD methods may have the following features: (1) throughput is improved by substantially reducing the precursor dose time in each cycle, (2) film thickness may be precisely modulated by depositing very thin sub-saturated layers per deposition cycle, in some cases the per cycle thickness being less than the largest bond length of the desired film; (3) in the aggregate, continuous thin films may be deposited; (4) deposited films may have improved properties, such as improved wet etch rate control; and (5) reduced precursor consumption since the surface is not entirely saturated by adsorbed molecules. Undersaturation may be controlled by limiting the flow or dose of reactive species to the surface.

In some embodiments, the dose phase of an ALD cycle concludes before the precursor evenly saturates the surface of the substrate. Typically, the precursor flow is turned off or diverted at this point, and only purge gas flows. By operating in this subsaturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety.

ALD and SS-ALD processes currently use the same process conditions from cycle to cycle, but in some SS-ALD processes the deposition may not be uniform. ALD, particularly sub-saturated ALD, is sensitive to type of showerhead and delivery method and flow, as well as partial pressure of precursor. Multiple ALD cycles may be repeated to build up stacks of conformal layers. In some implementations, each layer may have substantially the same composition whereas in other implementations, sequentially ALD deposited layers may have differing compositions, or in certain such implementations, the composition may alternate from layer to layer or there may be a repeating sequence of layers having different compositions, as described above.

Various types of hardware may be used. Examples are provided in U.S. patent application Ser. No. 14/578,166, filed on Dec. 19, 2014 entitled "HARDWARE AND PROCESS FOR FILM UNIFORMITY IMPROVEMENT," which is herein incorporated by reference in its entirety. FIG. 1 provides a schematic of a substrate process station illustrating precursor flow within a processing chamber during a deposition process. The substrate process station 100 includes a showerhead 102 and a pedestal 104 supporting a substrate 106.

Process gas 108 is delivered to the substrate 106 via the showerhead 102. In certain implementations, the process gas 108 may be a precursor or a combination of precursor and carrier gas. The substrate may adsorb the precursor and form an adsorption layer on the substrate 106. During certain phases of a deposition cycle, a purge gas or other process gases may flow via the showerhead 102 instead of the process gas 108.

Additionally, in FIG. 1, a purge gas 110 may flow along the exterior of the showerhead 102. In certain implementations, the purge gas 110 may prevent deposition on the backside of the showerhead 102.

The flow of the process gas 108 and the purge gas 110 around the interior of the substrate process station 100 may result in uneven dosing of the substrate 106. Uneven dosing may result in non-uniform processed substrates. In certain implementations, the flow of the process gas 108 over the surface of the substrate 106 may result in uneven dosing of area 112 on the surface of the substrate 106. Additionally, the flow of purge gas 110 may result in uneven dosing of areas 114A and 114B on the surface of the substrate 106. The results of uneven dosing in some implementations may result in non-uniform deposition.

The process gas 108 in FIG. 1 may be delivered through a process gas delivery system in a substrate processing apparatus. A process gas delivery system may include a configuration of flow paths and valves. Valves which may be used in precursor gas delivery systems include pneumatically and electrically actuated diaphragm-sealed or bellow-sealed valves and valve manifolds such as ALD valves, DP series valves from Swagelok, and MEGA series, Standard series and electrically controlled valves from Fujikin.

Provided herein are methods of depositing uniform layers using multi-cyclic ALD. In multi-cyclic ALD, more than one set of conditions for an ALD cycle is included in a "process cycle." A process cycle is defined as a unit of operations that are repeated over time. An ALD cycle is defined as the set of operations including at least one dose and one conversion step (e.g., an ALD cycle may be dose/purge/conversion/purge or conversion/purge/dose/purge or dose/conversion, etc.). Multi-cyclic ALD involves repeating process cycles that include more than one ALD cycle. Each ALD cycle in a process cycle may change the value of one or more parameters during any of the operations in an ALD cycle. In certain embodiments, some parameter values may not be changeable due to the time it takes to change the parameter value between cycles. For example, mass flow controller (MFC) flows, liquid flow controller (LFC) flows, and pressure may not be changed between cycles. In some apparatus, the time required to change the value of one or more of these parameters is on the order of the time required to perform a cycle. As a consequence, such parameter values cannot be realistically adjusted from cycle-to-cycle without dramatically reducing throughput. Of course, if an apparatus allows rapid adjustment, some parameter values may be varied dynamically.

In certain embodiments, one or more of the following parameter values are changed between cycles in a multi-cycle process: timing, such as dose time, which is controllable by a divert valve, duration of plasma exposure, and purge time; and different carrier gas flows, such as carrier gas flow on/off for flows at different rates and different compositions and some combination of carrier gases; and plasma power. The different carrier gas flows may be rapidly adjusted by controlling valve timing for various manifolds used to deliver the carrier gas(es).

Figure 2A:
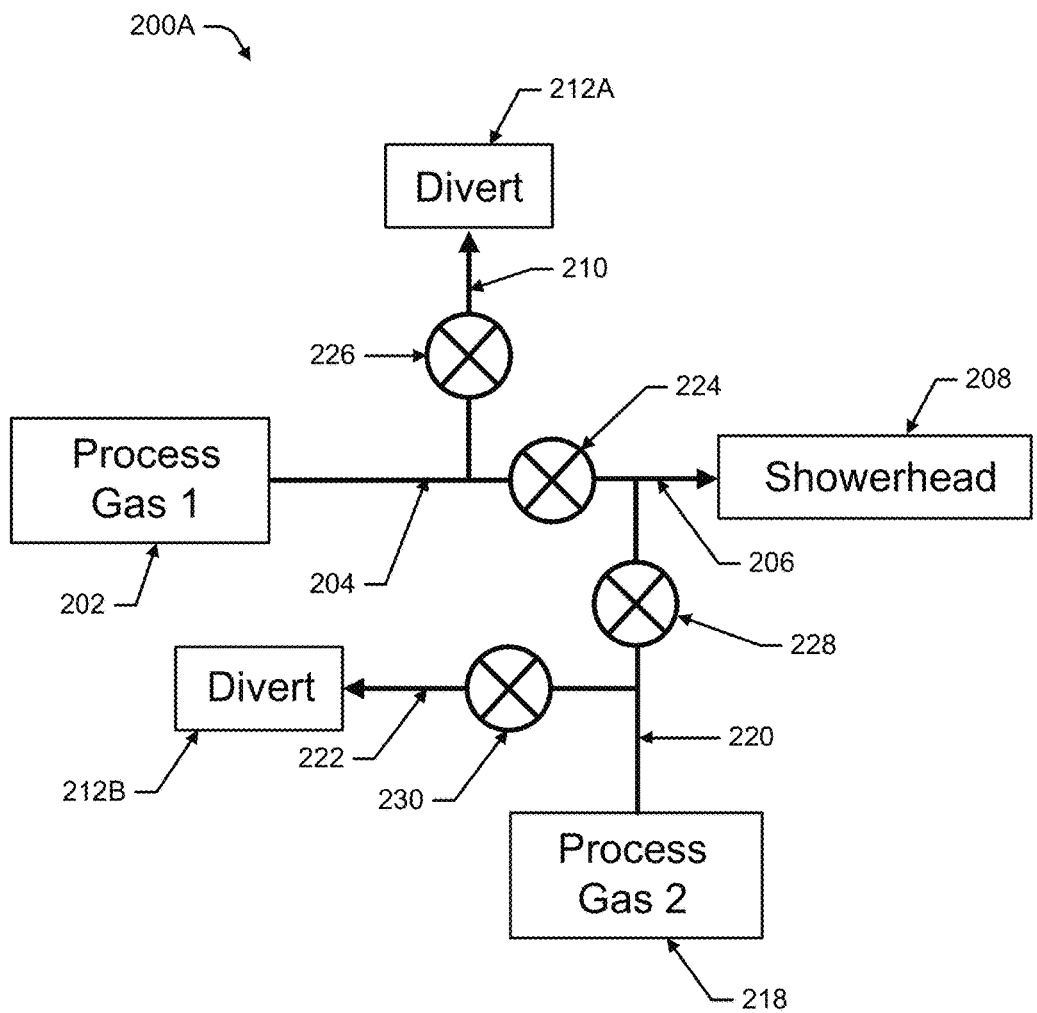
FIG. 2A is a schematic representation of a configuration of a multi-step precursor delivery system for a substrate process station.

Embodiments herein may involve various types of process gas flow. Precursor delivery systems, which may be referred to as multi-step precursor delivery systems, may be implemented with both vapor-based delivery systems and liquid delivery systems. Vapor-based delivery systems may use an ampoule to evaporate precursor. Liquid delivery systems may use a vaporizer to evaporate precursor. FIG. 2A is a schematic representation of a configuration of a multi-step precursor delivery system for a substrate process station.

The multi-step precursor delivery system 200A in FIG. 2A includes a first process gas source 202 connected to a first flow path 204 and a second process gas source 218 connected to a second flow path 220. In certain implementations, the first process gas from the first process gas source 202 may be a process gas which includes precursor and/or carrier gas. Additionally, the second process gas from the second process gas source 218 may be a process gas which includes precursor and/or carrier gas. The precursor and/or carrier gas used for the first and second process gases may be similar or different. The carrier gas may be a gas such as argon, nitrogen ($N_2$), oxygen ($O_2$), nitrous oxide ($N_2O$), helium, other inert gases, or a mixture of these gases. In certain other implementations, a carrier gas source may be shared between the first flow path and the second flow path, with a further precursor source connected to the first flow path and/or the second flow path. In such implementations, the carrier gas and the precursor may be mixed at some point before entering the showerhead. In certain implementations, single valves in the figures described herein may be replaced with multiple valves.

The first flow path 204 is fluidically connected to the showerhead flow path 206 and a first divert flow path 210. The showerhead flow path 206 leads to a showerhead 208 while the first divert flow path 210 leads to the first divert dump 212A. The flow of process gas from the first flow path 204 into the showerhead flow path 206 is controlled by a first showerhead valve 224. The flow of process gas from the first flow path 204 into the first divert flow path 210 is controlled by a first divert valve 226. In certain implementations, only one of the first showerhead valve 224 and the first divert valve 226 may be open at any one time. Additionally, in certain implementations, the first flow path may be directly connected to the showerhead, possibly with a first showerhead valve controlling the flow of process gas between the first flow path and the first showerhead. In such implementations, there may not be a first showerhead flow path.

The second flow path 220 is fluidically connected to the showerhead flow path 206 and a second divert flow path 222. The second divert flow path 222 leads to the second divert dump 212B. The flow of process gas from the second flow path 220 into the showerhead flow path 206 is controlled by a second showerhead valve 228. Flow from the second flow path 220 into the second divert flow path 222 is controlled by a second divert valve 230. In certain implementations, only one of the second showerhead valve 228 and the second divert valve 230 may be open at any one time In certain implementations, the multi-step precursor delivery system 200A may be controlled by a controller as described elsewhere in this disclosure. In certain implementations, the multi-step precursor delivery system 200A first delivers process gas from the first process gas source 202 to the showerhead 208 before delivering process gas from the second process gas source 218 to the showerhead 208 at a later time period. The delivery periods of the first process gas and second process gas may overlap. The timing of the delivery periods of the first process gas and the second process gas is described in greater detail elsewhere in this disclosure.

Figure 2B:
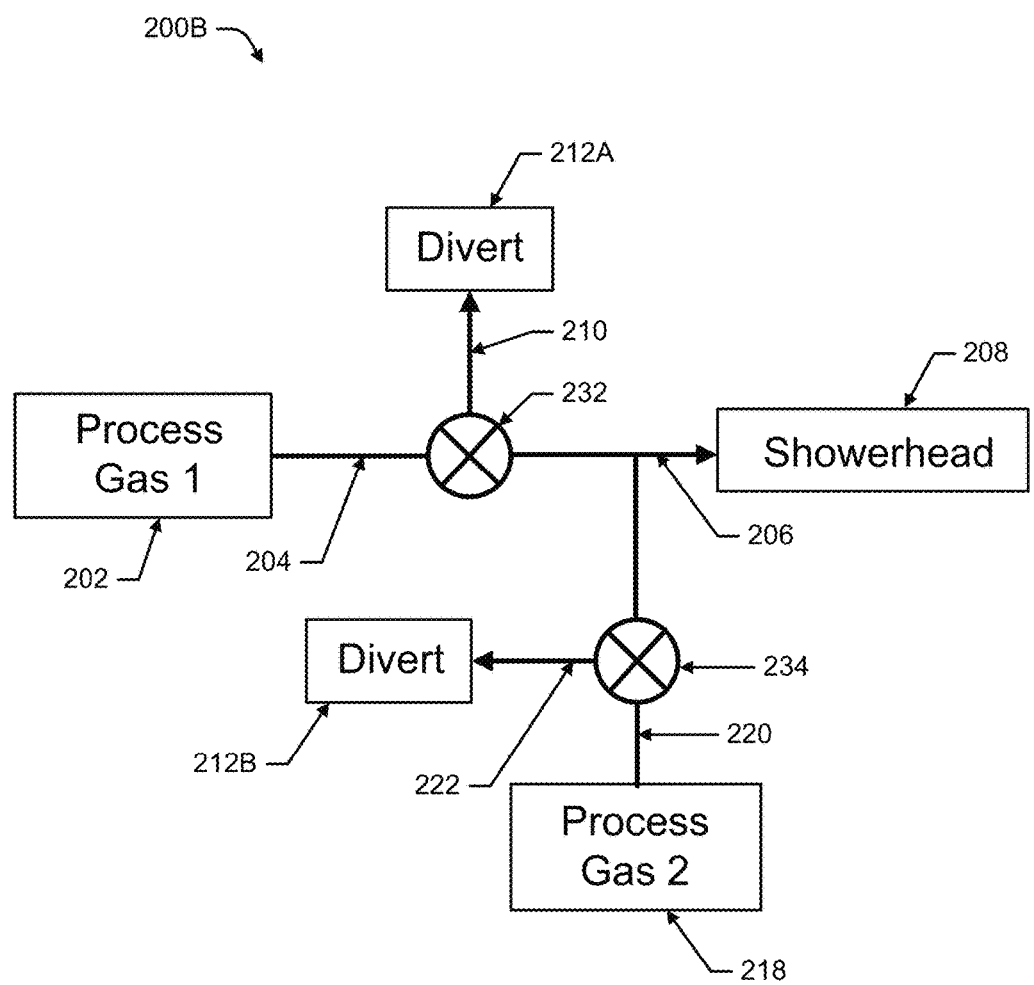
FIG. 2B is a schematic representation of another configuration of a multi-step precursor delivery system for a substrate process station.

FIG. 2B is a schematic representation of another configuration of a multi-step precursor delivery system for a substrate process station. The multi-step precursor delivery system 200B is similar in configuration to the delivery system 200A. In the multi-step precursor delivery system 200B the first showerhead valve 224 and the first divert valve 226 is replaced with a first flow path valve 232. In certain implementations, the first flow path valve 232 may be configured to alternatively direct process gas flow from the first flow path 204 towards either the showerhead flow path 206 or the first divert flow path 210.

Additionally, the second showerhead valve 228 and second divert valve 230 of the delivery system 200A in FIG. 2A has been replaced with a second flow path valve 234 in the multi-step precursor delivery system 200B in FIG. 2B. The second flow path valve 234 may be similar in configuration to the first flow path valve 232. In certain implementations, the second flow path valve 234 may alternatively direct process gas flow from the second flow path 220 towards either the showerhead flow path 206 or the second divert flow path 222.

Figure 2C:
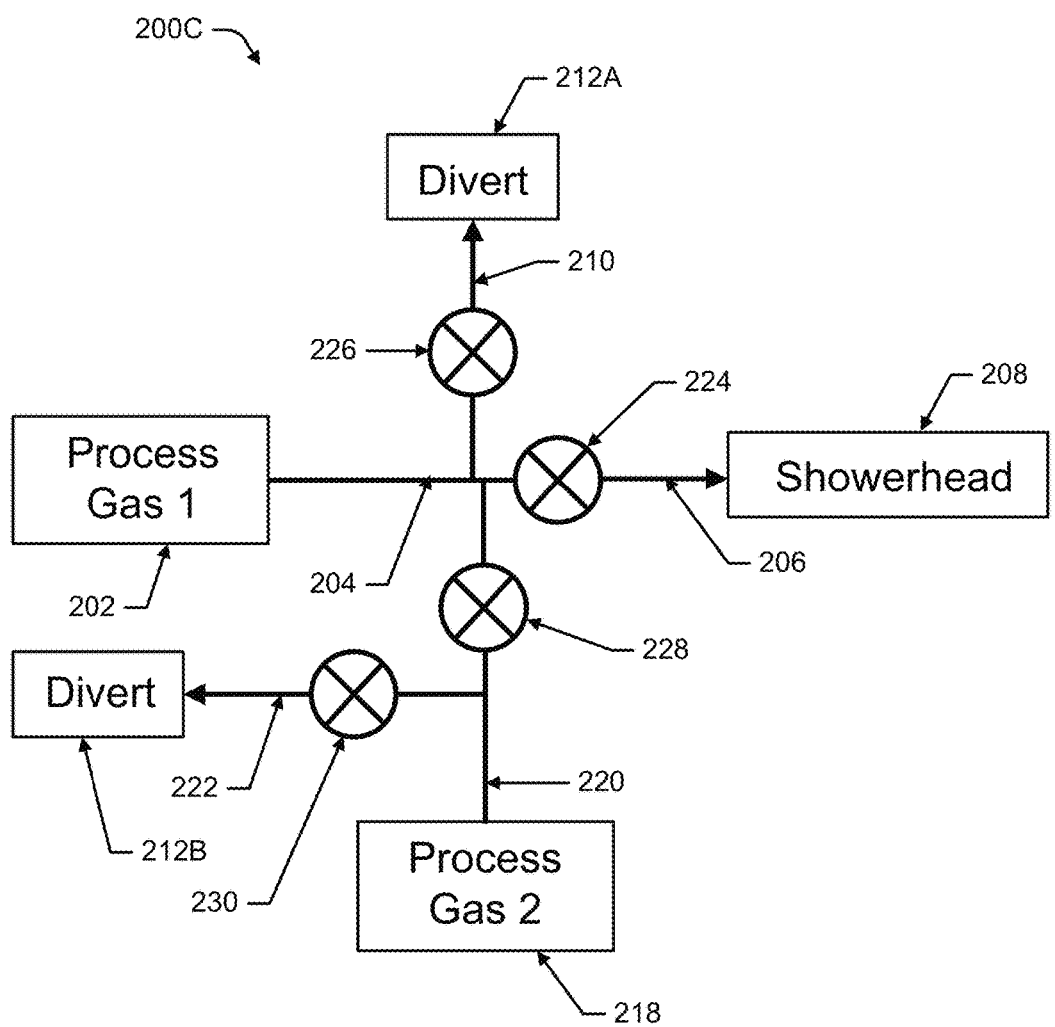
FIG. 2C is a schematic representation of an additional alternative configuration of a multi-step precursor delivery system for a substrate process station.

FIG. 2C is a schematic representation of an additional alternative configuration of a multi-step precursor delivery system for a substrate process station. The multi-step precursor delivery system 200C is similar in configuration to the delivery system 200A. In the multi-step precursor delivery system 200C, the second flow path 220 terminates into a portion of the first flow path 204. Thus, the first showerhead valve 224 may control the flow of both the first process gas and the first process gas to the showerhead 208. Such a configuration may be used when the first and second process gases are timed to cease flowing to the showerhead at the same time. In such cases, the first showerhead valve 224 may simultaneously shut off the flow of both process gases.

Figure 3:
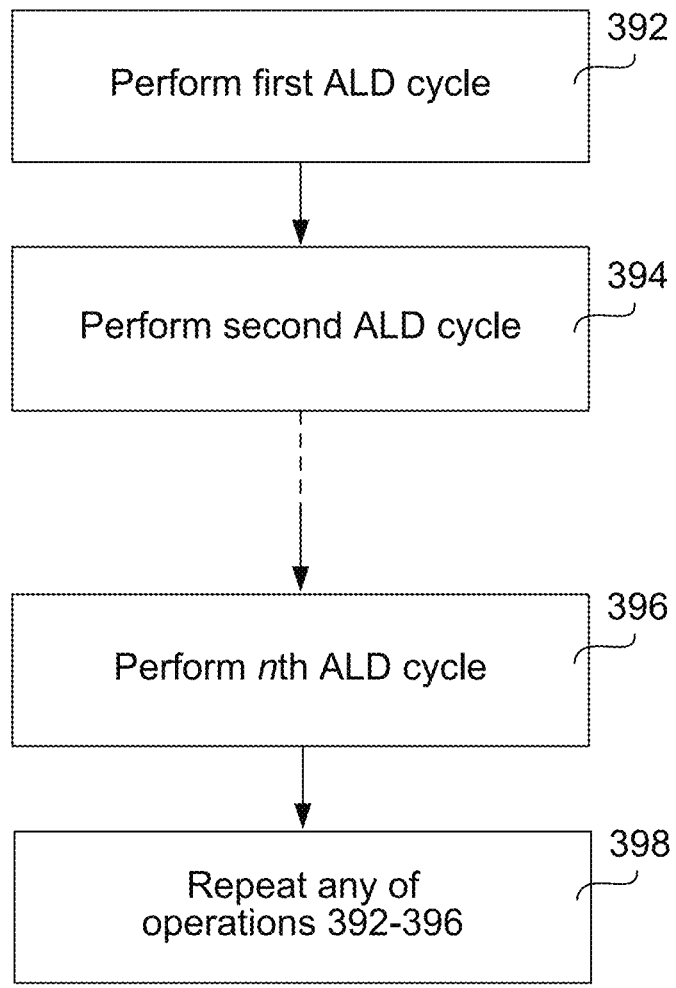
FIG. 3 is a process flow diagram depicting operations for a method in accordance with disclosed embodiments.

FIG. 3 provides a process flow diagram depicting multi-cyclic ALD in accordance with disclosed embodiments. In operation 392, a first ALD cycle is performed. An ALD cycle involves alternating between doses of two or more reactants with a purge step in between to remove excess reactant/by-products. In some embodiments, the ALD cycle involves plasma-enhanced ALD (PEALD) in a saturated or sub-saturated regime. During PEALD, a plasma is ignited during at least one of the doses in an ALD cycle. In operation 394, a second ALD cycle is performed. The second ALD cycle may be performed such that one or more parameter values are different from the first ALD cycle performed in operation 392. Examples of parameter values that may be different between the first and second ALD cycles include dose time, purge time, plasma exposure time, valve timing for carrier gas flow, and radio frequency (RF) plasma power and frequency. For example, in operation 394, the dose times during one cycle may be shorter than dose times in another cycle in operation 392. Further examples of varying parameter values between ALD cycles are described below.

In operation 396, the nth ALD cycle may be performed after potentially numerous intervening cycles. That is, any two or more ALD cycles may be performed in accordance with disclosed embodiments, with any one ALD cycle changing one or more parameter values. In various embodiments, each of 1st, 2nd . . . nth ALD cycles may be distinct from one another. For example, each of the n cycles may have different dose times. In some embodiments, only some of the n cycles may have different dose times. The order in which some of the operations are performed may be changed throughout the process. For example, for a process having three different dose times $t_1$, $t_2$, and $t_3$, the process may be performed in any combination of operations, including any of the following examples of cycling such operations:

Example 1 (repeated sequentially): $t_1$, $t_2$, $t_3$, $t_1$, $t_2$, $t_3$, $t_1$, $t_2$, $t_3$, $t_1$, $t_2$, $t_3$ . . . .

Example 2 (random cycles): $t_1$, $t_2$, $t_3$, $t_2$, $t_1$, $t_1$, $t_2$, $t_2$, $t_3$, $t_1$, $t_2$, $t_2$, $t_3$, $t_1$ . . . .

Example 3 (varied sequences): $t_1$, $t_2$, $t_1$, $t_2$, $t_3$, $t_1$, $t_2$, $t_1$, $t_2$, $t_3$, $t_1$, $t_2$, $t_1$, $t_2$, $t_3$ . . . .

In disclosed embodiments, n may be any integer greater than or equal to 2. In operation 398, operations 392-396 may be repeated. For example, if n=3, then the first, second, and third ALD cycles may be constitute a multi-cyclic ALD process cycle that is repeated. In various embodiments, an operation whereby one or more parameter value is changed may not be performed in every multi-cyclic ALD cycle, but may instead be performed after one of the other operations in a multi-cyclic ALD cycle is performed, or after performing one of the other operations two times, or three times, or more. In some embodiments, operations in a multi-cyclic ALD cycle may be performed randomly. In some embodiments, operations 392-396 may be referred to as one multi-cycle ALD process cycle, or "process cycle" as used herein. Note that a process cycle includes two or more ALD cycles, each of which may have a distinct set of parameter values, such as different dose times or different plasma powers, or different carrier gas flows. Disclosed embodiments are suitable for depositing any material using ALD, such as oxides, nitrides, and carbides of silicon.

Figure 4A:
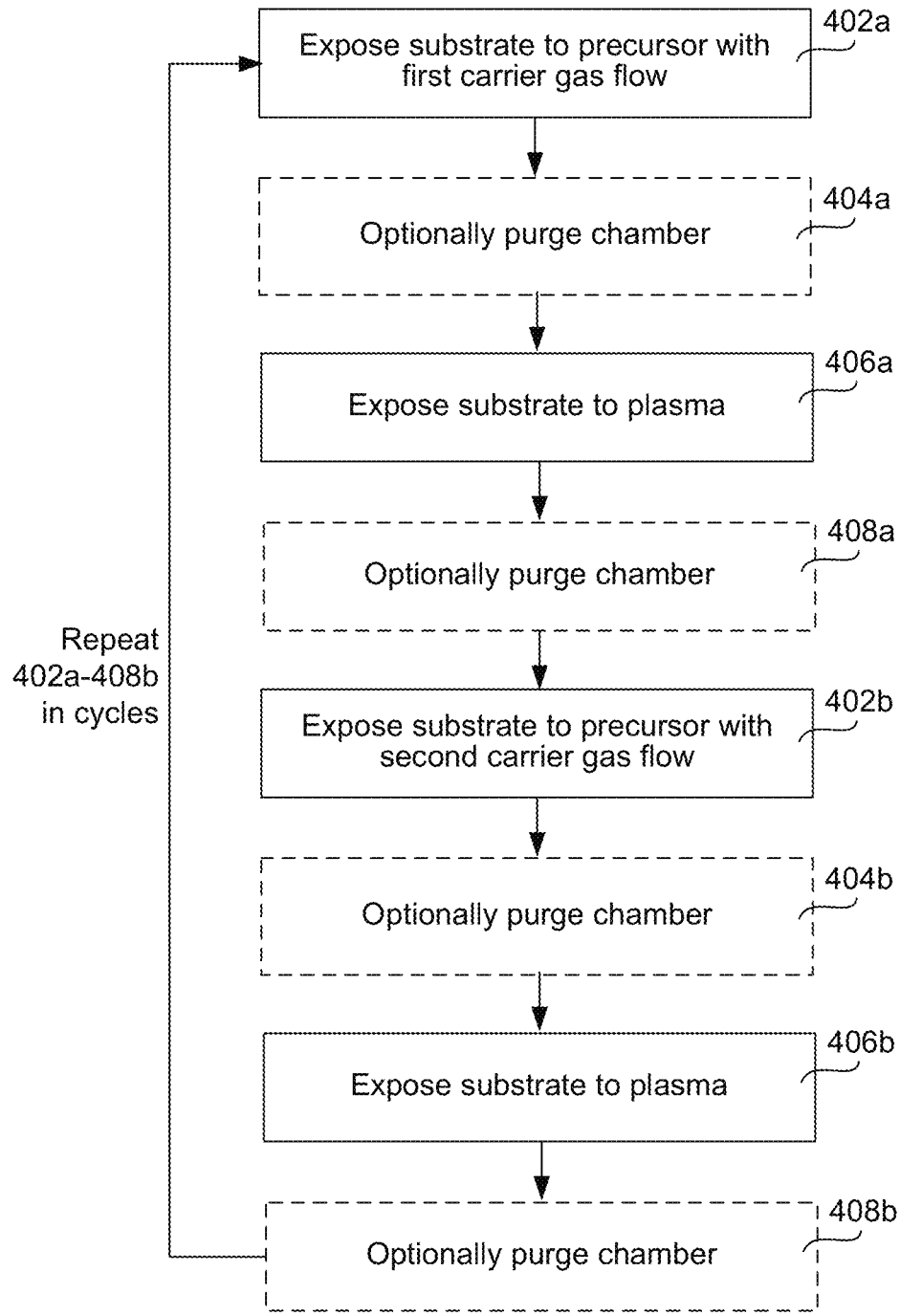
FIG. 4A is a process flow diagram depicting operations for an example of a method in accordance with disclosed embodiments.
Figure 4B:
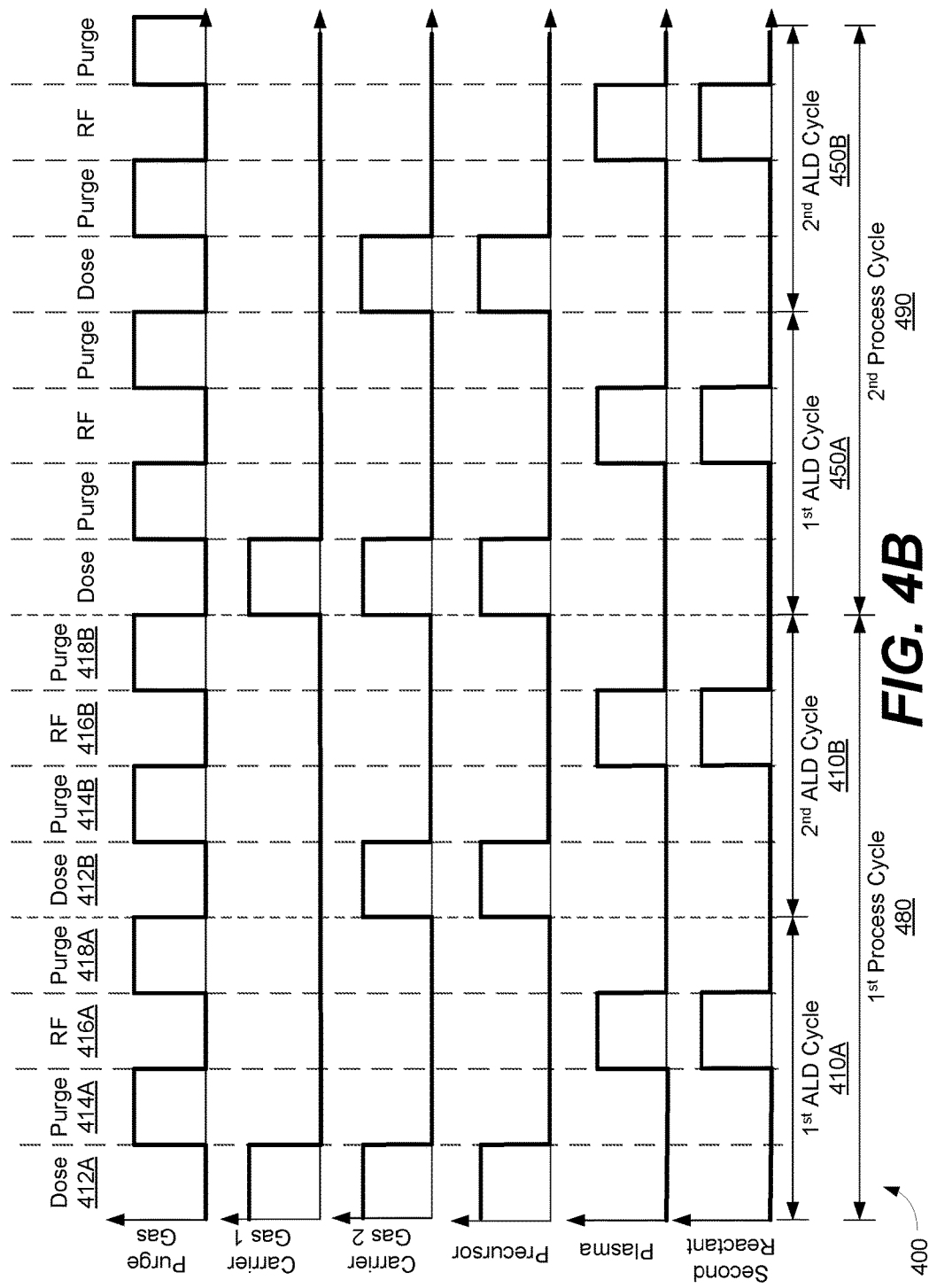
FIG. 4B is a timing sequence diagram showing an example of cycles in a method in accordance with disclosed embodiments.
Figure 5A:
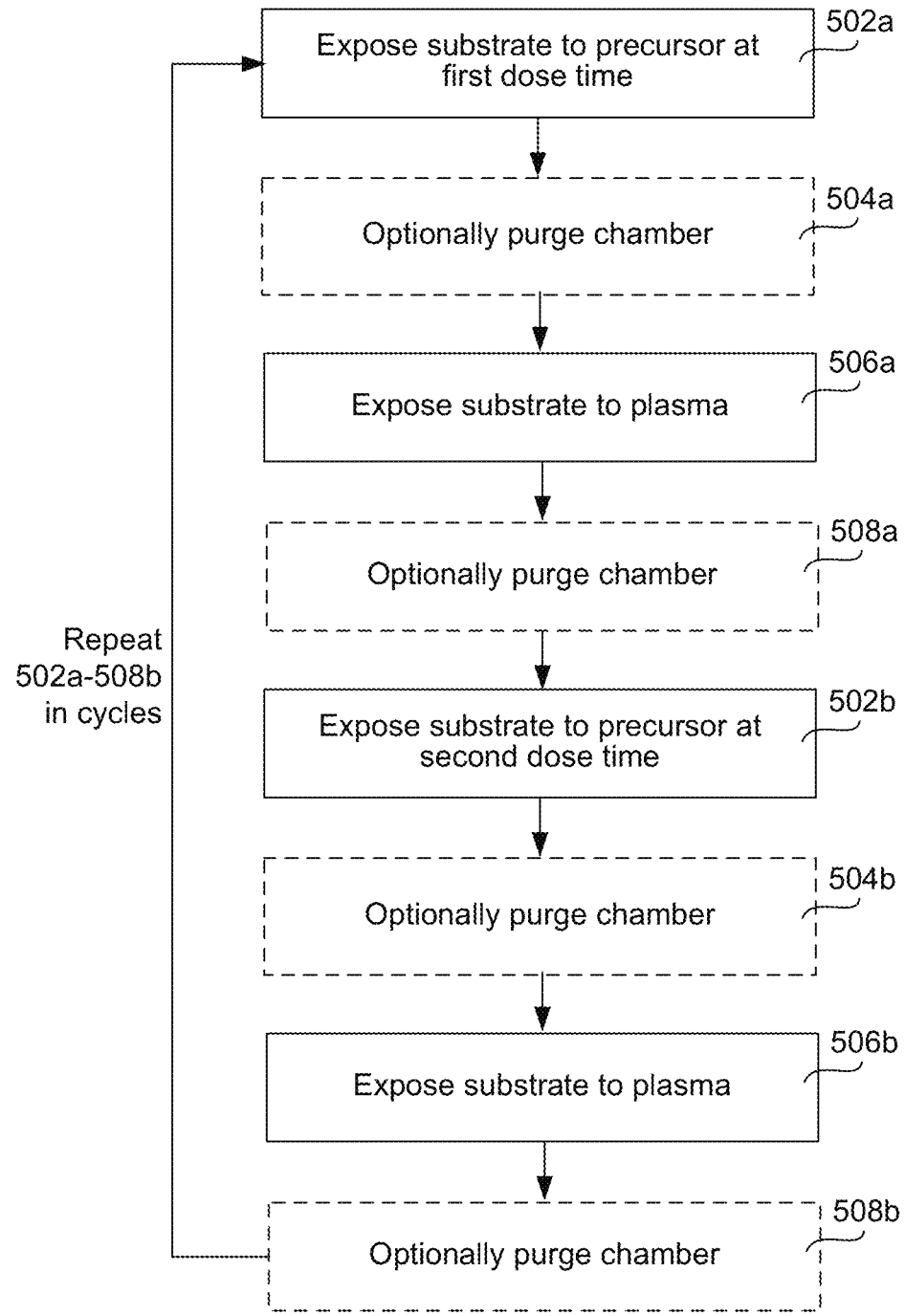
FIG. 5A is a process flow diagram depicting operations for an example of a method in accordance with disclosed embodiments.

Further examples of multi-cyclic ALD process cycles are provided herein. FIG. 4A shows an example process cycle including two ALD cycles where the carrier gas flow is varied from cycle to cycle. FIG. 4A corresponds to example timing schematic diagram FIG. 4B, which provides the various pulses and flows for each ALD cycle and each multi-cyclic ALD cycle. FIG. 5A shows an example process cycle including two ALD cycles where the precursor dose time is varied from cycle to cycle. FIG. 5A corresponds to example timing schematic diagram FIG. 5B, which provides the various pulses and flows for each ALD cycle and each multi-cyclic ALD cycle. FIGS. 4A and 4B will be discussed together below.

In FIG. 4A, in operation 402*a*, a substrate is exposed to a precursor at a first carrier gas flow. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In various embodiments, the substrate is patterned. A patterned substrate may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature may have an aspect ratio of at least about 1:1, at least about 2:1, at least about 4:1, at least about 6:1, at least about 10:1, or higher. The feature may also have a dimension near the opening, e.g., an opening diameter or line width of between about 10 nm to 10 μm, for example between about 25 nm and about 1 μm. Disclosed methods may be performed on substrates with features having an opening less than about 250 nm. A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature.

The carrier gas used in operation 402*a* may be nitrogen, argon or other inert gas, oxygen, nitrous oxide, a combination of inert gases or other process gases. The substrate may be exposed to a precursor for a duration sufficient to saturate less than 100% of the substrate surface. Example durations depend on wafer chemistry, type of precursor, precursor flow rate, patterns on the wafer, and other factors. Duration may be selected depending on the type of substrate profile desired. In some embodiments, the duration of the precursor exposure may be shorter to adsorb less precursor near the edge of the substrate to form a thinner layer near the edge, and a thicker layer in the middle of the substrate. In some embodiments, the duration of the precursor exposure may be longer to adsorb more precursor near the edge of the substrate to form a thicker layer near the edge. In some embodiments, the substrate may be exposed during operation 402*a* for a duration less than about 5 seconds, or between about 0.05 second and about 3 seconds. For deposition of oxides, the dose time may be between about 0.05 seconds and about 0.5 seconds. The substrate is exposed to a precursor or a first reactant. The precursor may be selected depending on the type of material to be deposited. For example, to deposit a silicon nitride or a silicon oxide film, a silicon-containing precursor may be used during operation 402*a*.

In operation 404*a*, the chamber is optionally purged to remove excess precursor in gas phase that did not adsorb onto the surface of the substrate. Purging may involve a purge or sweep gas, which may be a carrier gas used in other operations or a different gas. In some embodiments, the purge gas may be nitrogen, argon or other inert gas, oxygen, nitrous oxide, a combination of inert gases, or combinations thereof. In some embodiments, the purge gas is the same chemistry as the carrier gas used during precursor doses. In some embodiments, the purge gas is the same gas flowed during a plasma operation as further described below. In some embodiments, the purge gas is flowed from the same gas source from where carrier gas is flowed. In some embodiments, purging may involve evacuating the station. In some embodiments, a purge may include one or more evacuation purges for evacuating the process station. In some embodiments, the purge may be performed for any suitable duration, such as between about 0 seconds and about 60 seconds. In some embodiments, increasing a flow rate of a one or more sweep gases may decrease the duration of the purge. For example, a purge gas flow rate may be adjusted according to various reactant thermodynamic characteristics and/or geometric characteristics of the process station and/or process station plumbing for modifying the duration of operation 404*a*. In one nonlimiting example, the duration of a sweep phase may be adjusted by modulating sweep gas flow rate. This may reduce deposition cycle time, which may improve substrate throughput. After a purge, some precursor molecules may remain adsorbed onto the substrate surface.

In operation 406*a*, the substrate is exposed to a plasma. For example, the substrate may be exposed to a second reactant capable of reacting with the precursor to form a material on the surface of the substrate while a plasma is ignited to catalyze the reaction. The second reactant may be selected depending on the type of film to be deposited. For example, for a silicon nitride film, the substrate may be exposed to a nitrogen-containing reactant while a plasma is ignited in operation 406*a* to deposit the silicon nitride film. As another example, for a silicon oxide film, the substrate may be exposed to an oxygen-containing reactant while a plasma is ignited in operation 406*a* to deposit a silicon oxide film.

In operation 408*a*, the chamber is again optionally purged. The purge conditions in some embodiments may be the same as the purge conditions in operation 404*a*. In some embodiments, purge conditions may be varied. For purposes of this example, the purge conditions may be the same as those in operation 404*a*.

Operations 402*a*-408*a* may constitute one ALD cycle of a multi-cycle ALD process cycle. In FIG. 4A, another ALD cycle of the multi-cycle ALD process cycle is provided in operations 402*b*-408*b*. However, the second ALD cycle provided in operations 402*b*-408*b* involve one or more different parameter values than in operations 402*a*-408*a*. The operations 402*b*-408*b* in FIG. 4A provide one example whereby the carrier gas flow during precursor exposure is different than the carrier gas flow in the first ALD cycle in the process chamber. As shown, in operation 402*b*, the substrate is exposed to a precursor with a second carrier gas flow. Compared to operation 402a, carrier gas flow in operation 402b may involve a greater carrier gas flow rate than that of operation 402a, a lower carrier gas flow rate, a different gas flow composition, or other variation. For example, an operation for exposing the substrate to a high carrier gas flow may involve flowing a carrier gas at a flow rate of less than about 20 L for a four-station tool, or about 5 L for a single substrate. An operation for exposing the substrate to a low carrier gas flow may involve flowing a carrier gas at a flow rate of less than about 1000 sccm for a four-station tool, or about 250 sccm for a single substrate.

In some embodiments, a higher carrier gas flow rate may be at least about 9 L for one ALD cycle, while the lower carrier gas flow rate may be about 3 L or less, for an apparatus including four showerheads (e.g., four stations, each including a pedestal for holding a substrate 300 mm in size). The relative flow rates may depend on the hardware. For some hardware, the relationship between carrier gas flow and type of resulting profile on the substrate may not be linear. For example, in some embodiments, a high carrier gas flow used in, for example, operation 402a at about 9 L may result in an edge thick profile, and a low carrier gas flow used in, for example, operation 402b, at about 3 L may result in an edge thin profile, but flowing carrier gas at a flow rate of about 6 L may not result in a uniform deposition profile.

In some embodiments, the substrate may be processed in a chamber including two or more manifolds, each of which are capable of flowing carrier gas. One manifold may also be used to deliver precursor gas. In operation 402a, two manifolds may deliver carrier gas, whereas in operation 402b, only one manifold may deliver carrier gas. In some embodiments, the carrier gases in the manifolds may be the same. In some embodiments, the carrier gases in the manifolds may be different.

In operation 404b, the chamber is optionally purged. In this example, the chamber conditions during purge may be the same as in operation 404a, however it is understood that in some embodiments, purge conditions may also be varied from cycle to cycle. In operation 406b, the substrate is exposed to a plasma to form the material to be deposited on the substrate. In various embodiments, operation 406b may involve the same conditions as operation 406a. Again it is understood that in some embodiments, conditions during operation 406b may be changed from cycle-to-cycle and may not necessarily be the same as that of operation 406a. In operation 408b, the purge is again optionally performed, similar to operation 408a. Again, here, operation 408b may not necessarily involve the same conditions as that of operation 408a.

Operations 402a-408b may then be repeated in cycles to deposit a material using this multi-cyclic ALD process. Note that the example provided in FIG. 4A includes two ALD cycles in a multi-cyclic ALD process, but in some embodiments, more than two ALD cycles may be included such as three cycles, four cycles, five cycles, or more. For example, for a three-cycle multi-cyclic ALD process, the carrier gas flow in the first ALD cycle may involve flowing Gas A and Gas B, the carrier gas flow in the second ALD cycle may involve flowing just Gas A without Gas B, and the carrier gas flow in the third ALD cycle may involve flowing just Gas B without Gas A.

FIG. 4B provides a timing schematic diagram showing an example of a process 400 where the multi-cyclic ALD cycle in FIG. 4A is repeated.

As shown, the first multi-cyclic ALD cycle 480 includes both the first ALD cycle 410A and 2nd ALD cycle 410B. The process is again repeated in the second process cycle 490, which includes the first ALD cycle 450A and second ALD cycle 450B.

The first ALD cycle 410A includes a dose phase 412A, which corresponds to operation 402a in FIG. 4A. During this operation, both carrier gas 1 and carrier gas 2 are flowed, along with the precursor, while the plasma and second reactant are both turned off. In the purge phase 414A, purge gas is flowed and the plasma is off while the chamber is evacuated. This phase corresponds to operation 404a in FIG. 4A. In RF phase 416A, the substrate is exposed to a plasma and the second reactant is flowed to react with the adsorbed precursor on the surface. This operation corresponds to operation 406a. In purge phase 418A, a purge gas is flowed and the plasma is turned off to evacuate the chamber. In the second ALD cycle 410B, the dose phase 412B involves flowing only carrier gas 2 while carrier gas 1 is turned off, and the precursor is flowed. This corresponds to operation 402b in FIG. 4A, where a second carrier gas is flowed. Compared to the dose phase 412A, only one carrier gas is flowed. In purge phase 414B, which corresponds to operation 404b of FIG. 4A, a purge gas is flowed and no plasma is ignited. In RF phase 416B, which corresponds to operation 406b of FIG. 4A, the plasma is turned on and the second reactant is flowed. In purge phase 418B, which corresponds to operation 408b of FIG. 4A, a purge gas is flowed and no plasma is ignited. FIG. 4B shows phases for repeating operations 402a-408b of FIG. 4A, such that the second process cycle 490 includes the dose phase 412A with two carrier gas flows and precursor flow, purge phase 414A, RF phase 416A, purge phase 418A, then dose phase 412B involving one carrier gas flow with precursor flow, purge phase 414B, RF phase 416B, and purge phase 418B.

FIGS. 5A and 5B provide another example of a multi-cyclic ALD process where a parameter value is changed from cycle to cycle; in this example, the parameter is dose time during precursor exposure. As shown in FIG. 5A, in operation 502a, the substrate is exposed to a precursor at a first dose time. The first dose time may be between about 50 ms to about 100 ms. In operation 504a, the chamber is optionally purged to remove any precursor molecules not adsorbed to the surface of the substrate. The purge may have any of the parameter values described above with respect to operation 504a of FIG. 5A.

In operation 506a, the substrate is exposed to a plasma. During this operation, a second reactant flows to the substrate and the plasma is turned on to ignite the second reactant such that the second reactant reacts with the adsorbed precursor to form a film on the substrate. Process conditions may be any of those described above with respect to operation 406a of FIG. 4A.

In operation 508a, the chamber is again optionally purged. The purge conditions may be any of those described above with respect to operation 404a of FIG. 4A.

Operations 502a-508a may constitute one ALD cycle of a multi-cyclic ALD process. In operation 502b, the substrate is exposed to a precursor at a second dose time. The second dose time may be greater than or less than the dose time of operation 502a. In some embodiments, the first or second dose time may be at least about 0.05 second. In certain embodiments, the difference between the first, second and subsequent dose times is about 0.025 second or longer. For example, if the dose time of operation 502a is about 0.1 seconds, the dose time of operation 502b may be about 0.125 seconds or higher. The dose time may be selected depending on the desired deposition result. For example, in operation 502a, the dose time may be about 0.1 seconds, which causes precursor to be preferentially adsorbed toward the center of the wafer due to showerhead and chamber design. In operation 502b, the dose time may then be about 0.3 seconds to saturate precursor adsorption in the center and increase precursor on the edges of the substrate to more uniformly deposit a film on the substrate. In operation 504b, the chamber is optionally purged, which may involve any conditions described above with respect to operation 404a in FIG. 4A. In operation 506b, the substrate is exposed to a plasma. In operation 508b, the chamber is again optionally purged. Operations 502a-508b may constitute one multi-cyclic ALD process including two ALD cycles with a varied parameter being dose time during precursor exposure and these operations may be repeated in cycles. The process does not need to unfold with cycle "a" and cycle "b" being paired at all points in the ALD process. For example, the "b" cycle may be performed once for every two or more "a" cycles. Or the "b" cycle may be performed irregularly or even randomly as determined before deposition or during deposition, through real-time feedback on the process.

For dose time variation, in some embodiments, dose time depends on the type of pattern on the substrate. For example, trenches may be fairly deep with high aspect ratio e.g. trenches can be as deep as 2-5 µm with trench opening between about 0.1 and about 0.5 µm. The dose time may be longer to allow diffusion into the trenches, for example greater than about 0.2 second. Using shorter dose times for such trenches in a multi-cyclic ALD process e.g. about 0.1 second, the material may primarily grow toward the top or opening of the trench or feature, which may result in voids in the trench. Longer dose time may yield a conformal film along the trench wall whereas shorter dose time may increase film growth at or near the top of a trench. Multi-cyclic ALD can use such variation to create a controlled air gap or void desirable for certain applications.

FIG. 5B shows an example of a process 500 whereby operations 502a-508b in FIG. 5A are repeated in cycles.

As shown, the first process cycle 580 includes both the first ALD cycle 510A (which correspond to operations 502a-508a) and second ALD cycle 510B (which correspond to operations 502b-508b). The first ALD cycle 510A involves a dose phase 512A corresponding to operation 502a of FIG. 5A whereby a carrier gas is flowed, a precursor is flowed, no plasma is flowed, and no second reactant is flowed. Note the length of the dose is represented by the length of the horizontal line corresponding to the precursor exposure, or the x-axis of the precursor schematic. Purge phase 514A includes only purge gas flow and corresponds to operation 504a of FIG. 5A. The RF phase 516A corresponds to operation 506a of FIG. 5A, whereby the second reactant is flowed and the plasma is turned on. Purge phase 518A corresponds to operation 508A, and only the purge gas is flowed. The carrier gas is flowed whenever precursor gas is flowed; e.g., at every dose phase. Here, the carrier gas flow represents the carrier gas used to carry the precursor gas into the chamber and is pulsed into the chamber where a substrate is housed.

In the second ALD cycle 510B, the dose phase 512B corresponds to operation 504b of FIG. 5A. During the dose phase 512B, the carrier is flowed with a precursor for a dose time longer than that of dose phase 512A. Note that in some embodiments, the reverse may be true—dose phase 512B may be shorter than that of dose phase 512A. Purge phase 514B may correspond to operation 504b of FIG. 5A. During purge phase 514B, only carrier gas is flowed, and precursor flow and second reactant flow are turned off, as is the plasma. In RF phase 516B, which corresponds to operation 506b of FIG. 5A, the second reactant is flowed and the plasma is turned on. Purge phase 518B corresponds to operation 508b, and during purge phase 518B, only the purge gas is flowed.

The first process cycle 580 is repeated in the example provided in FIG. 5B as shown in second process cycle 590. Second process cycle 590 includes a first ALD cycle 550A, corresponding to repeating operations 502a-508a of FIG. 5A. First ALD cycle 550A includes the same operations as first ALD cycle 510A, such that there is a dose phase 552A, purge phase 554A, RF phase 556A, and purge phase 558A. These operations are the same as dose phase 512A, purge phase 514A, RF phase 516A, and purge phase 518A, respectively. The dose time of 552A is the same as that of dose time 512A.

A second ALD cycle 550B is performed, which includes the same operations as second ALD cycle 510B. These operations correspond to operations 502b-508b in FIG. 5A. Second ALD cycle 550B involves a dose phase 552B, a purge phase 554B, an RF phase 556B, and purge phase 558B. These correspond to dose phase 512B, purge phase 514B, RF phase 516B, and purge phase 518B, respectively. The duration of dose phase 552B is the same as that of dose phase 512B. As described above for first process cycle 580, the dose phase 552B duration is longer than that of dose phase 552A, such that dose time is varied from ALD cycle to ALD cycle within one multi-cyclic ALD process cycle.

Although embodiments described herein involve exposing the substrate to a plasma during the second reactant exposure, disclosed embodiments may also be used for thermal processes. In some embodiments involving thermal ALD, the gas is distributed through a tube to more uniformly distribute gas to the chamber. In embodiments involving plasma-enhanced ALD, the gas may be flowed through a showerhead as described below to tailor the deposition profile. In some embodiments, only a single reactant is used and a thermal or plasma operation is used to convert adsorbed precursor to a desired deposition material.

Apparatus

Figure 6:
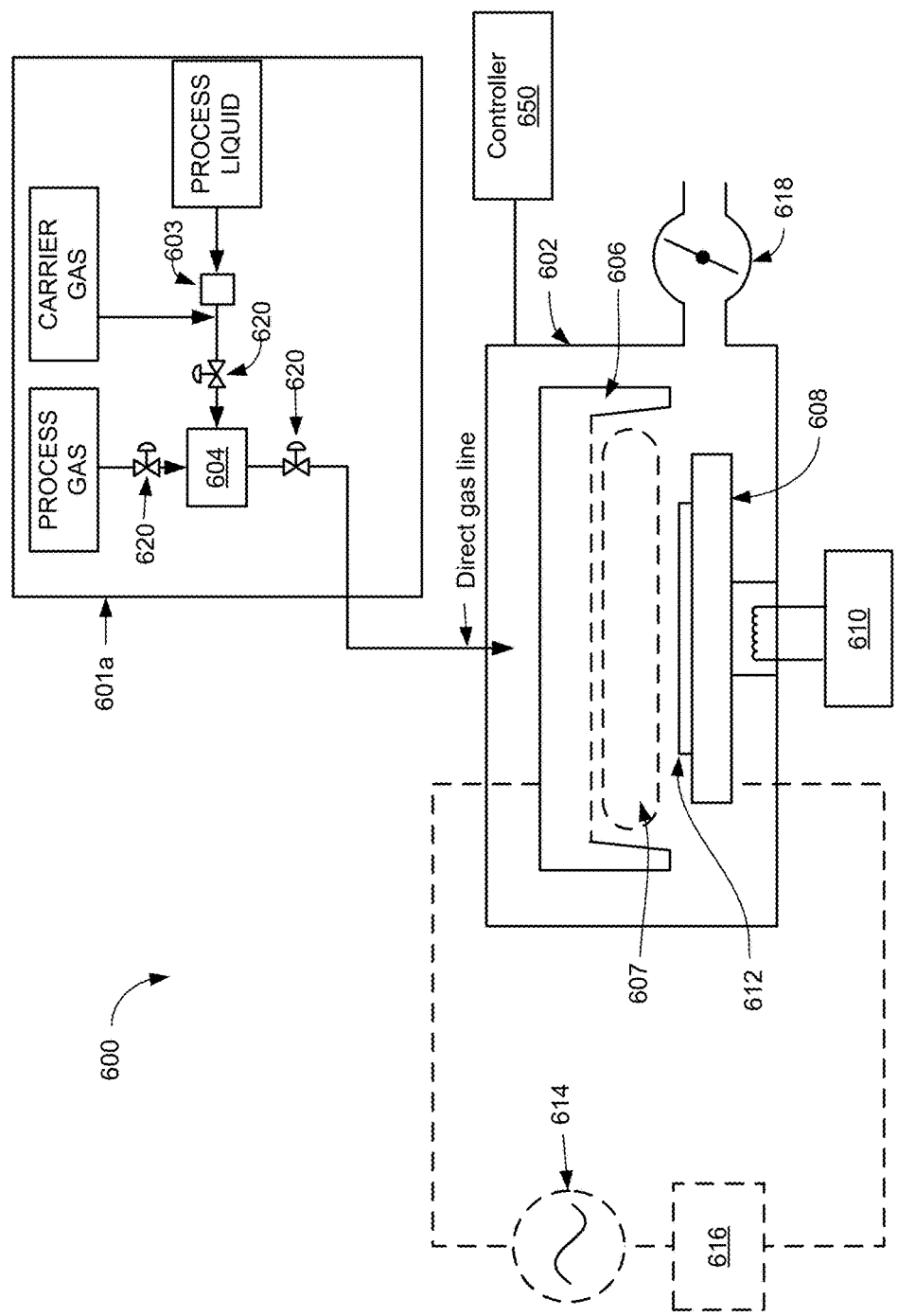
FIG. 6 is a schematic diagram of an example process station for performing disclosed embodiments.

FIG. 6 depicts a schematic illustration of an embodiment of an atomic layer deposition (ALD) process station 600 having a process chamber body 602. The ALD process station 600 may be suitable for processing substrates in a low-pressure environment in some embodiments. In some embodiments, one or more hardware parameter values of ALD process station 600, including those discussed in detail below may be adjusted programmatically by one or more computer controllers 650. In various embodiments, parameter values of an ALD process are varied across cycles in a multi-cyclic ALD process as described herein. Variation of the parameter values may be made in a determined manner or based on real-time feedback. Additional examples and further embodiments are described below.

ALD process station 600 fluidly communicates with reactant delivery system 601a for delivering process gases to a distribution showerhead 606. Reactant delivery system 601a includes a mixing vessel 604 for blending and/or conditioning process gases for delivery to showerhead 606. For example, the reactant delivery system 601a may include mass flow controllers and liquid flow controllers as described below. One or more mixing vessel inlet valves 620 may control introduction of process gases to mixing vessel 604. In various embodiments, delivery of one or more process gases to the showerhead 606 or to the process chamber 602 may be varied across cycles. For example, the duration of dosing one or more process gases may be varied. In disclosed embodiments, a controller 650 may control the diversion of one or more process gases by controlling one or more inlet valves 620. Variation of gas delivery may be made in a determined manner. For example, a recipe may be programmed to the controller 650 for diverting a first process gas every n cycles of flowing a second process gas, where n is an integer greater than or equal to 1. In some embodiments, carrier gases delivered by reactant delivery system 601a may also be varied from cycle to cycle. For example, the dose duration may be varied across cycles. In some embodiments, variation of gas delivery may be based on real-time feedback. For example, a detector (not shown) may determine how much film was deposited on substrate 612 over time, and dose times of one or more gases (such as process gases or carrier gases) may be varied across cycles in a multi-cyclic ALD process to accommodate the state of substrate 612 at any given time.

As an example, the embodiment of FIG. 6 includes a vaporization point 603 for vaporizing liquid reactant to be supplied to the mixing vessel 604. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 30° C. to approximately 150° C. at mixing vessel 604.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process station 600. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a pedestal 608. Showerhead 606 may have any suitable shape, and may have any suitable number and arrangement of ports for distributing process gases to substrate 612.

In some embodiments, a microvolume 607 is located beneath showerhead 606. Practicing disclosed embodiments in a microvolume rather than in the entire volume of a process station may reduce reactant exposure and purge times, may reduce times for altering process conditions (e.g., pressure, temperature, etc.), and may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 608 may be raised or lowered to expose substrate 612 to microvolume 607 and/or to vary a volume of microvolume 607. For example, in a substrate transfer phase, pedestal 608 may be raised to position substrate 612 within microvolume 607. In some embodiments, microvolume 607 may completely enclose substrate 612 as well as a portion of pedestal 608 to create a region of high flow impedance.

Optionally, pedestal 608 may be lowered and/or raised during portions the process to modulate process pressure, reactant concentration, etc., within microvolume 607. In one scenario where process chamber body 602 remains at a base pressure during the process, lowering pedestal 608 may allow microvolume 607 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 650. In some embodiments, location of the pedestal 608 may be varied across cycles. For example, in some ALD cycles, the pedestal 608 may be raised, and in some ALD cycles, the pedestal 608 may be lowered. Variations as described herein may be dependent on real-time feedback or a determined recipe.

In another scenario, adjusting a height of pedestal 608 may allow a plasma density to be varied during plasma activation and/or deposition cycles included in disclosed multi-cyclic ALD processes. At the conclusion of the process phase, pedestal 608 may be lowered during another substrate transfer phase to allow removal of substrate 612 from pedestal 608.

While the example microvolume variations described herein refer to a height-adjustable pedestal, it will be appreciated that, in some embodiments, a position of showerhead 606 may be adjusted relative to pedestal 608 to vary a volume of microvolume 607. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650.

In some embodiments where plasma may be used as discussed above, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. Such parameter values may be varied from ALD cycle to ALD cycle in a multi-cyclic ALD process as described herein. For example, RF power supply 614 and matching network 616 may be operated at any suitable power to form a plasma having a desired composition of radical species during one or more ALD cycles. Examples of suitable powers are included above. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameter values may be modulated discretely or continuously to provide plasma energy for the surface reactions. In one non-limiting example, the plasma power may be intermittently pulsed to reduce ion bombardment with the substrate surface relative to continuously powered plasmas. In some embodiments, the plasma power can be between about 50 W and about 6000 W.

In various embodiments, the RF power or RF frequency or both may be varied across cycles. In some embodiments, the RF power in combination with one or more other parameter values of an ALD process may be varied from cycle to cycle, or every n cycles, or randomly. For example, in some embodiments, a high RF power may be used in one ALD cycle while a low RF power is used in the next ALD cycle, and so on. In some embodiments, more than two variations in RF power may be used in a multi-cyclic ALD process.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameter values may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameter values may be included in a recipe phase. For example, a first recipe phase may include instructions for setting a flow rate of an inert and/or a reactant gas (e.g., the first precursor such as silane), instructions for setting a flow rate of a carrier gas (such as nitrogen or argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the second precursor such as oxygen), instructions for setting a plasma RF power, instructions for modulating a flow rate of a carrier gas which may be the same as or different from the flow rate in the first recipe phase, plasma conditions, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. More recipe phases may also be used. For example, another recipe phase may include plasma conditions different from that of the third recipe phase for embodiments varying plasma conditions from cycle to cycle, or every n cycles, or randomly, or dependent on real-time feedback. It will be appreciated that these recipe phases may be further subdivided and/or iterated in any suitable way within the scope of the present disclosure.

In some embodiments, pedestal 608 may be temperature controlled via heater 610. Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600. The process station 600 may include a control 650 for controlling example recipes as described above.

In some implementations, a controller 650 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 650, depending on the processing requirements and/or the type of system, may be programmed to control any of the processes disclosed herein, including the delivery of processing gases and/or variation of different dose times for delivery of process gases including diversion of one or more gases, temperature settings (e.g., heating and/or cooling), pressure settings, vacuum settings, power settings, radio frequency (RF) generator settings and/or variation of RF power settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 650, in some implementations, may be a part of or coupled to a computer that is integrated with, coupled to the system, otherwise networked to the system, or a combination thereof. For example, the controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 650 receives instructions in the form of data, which specify parameters for each of the processing steps to be performed during one or more operations. It should be understood that the parameters may be specific to the type of process to be performed and the type of tool that the controller 650 is configured to interface with or control. Thus as described above, the controller 650 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 650 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 7:
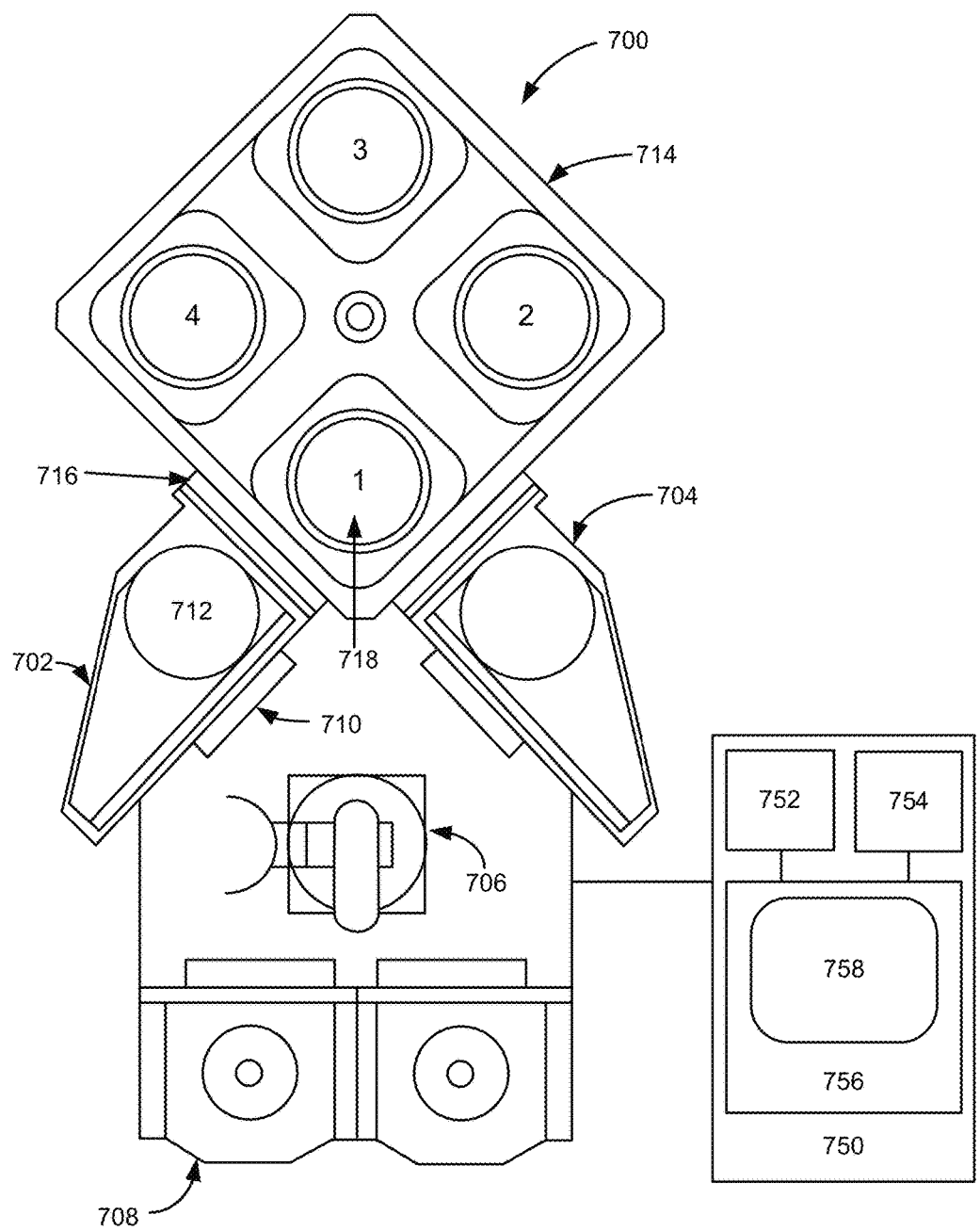
FIG. 7 is a schematic diagram of an example process tool for performing disclosed embodiments.

As described above, one or more process stations may be included in a multi-station processing tool. FIG. 7 shows a schematic view of an embodiment of a multi-station processing tool 700 with an inbound load lock 702 and an outbound load lock 704, either or both of which may comprise a remote plasma source. A robot 706, at atmospheric pressure, is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Where the inbound load lock 702 comprises a remote plasma source, the wafer may be exposed to a remote plasma treatment in the load lock prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 comprises four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 714 may include one or more matched pairs of ALD and plasma-enhanced ALD process stations. While the depicted processing chamber 714 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., silane, nitrogen, and purge gases as described herein) and flow rates and optionally for flowing gas into one or more process stations prior to deposition in order to stabilize the pressure in the process station. For example, a process gas control program may include code for changing duration of process gas doses across cycles in a multi-cyclic ALD process. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein. For example, a plasma control program may include code for varying RF power levels across cycles.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameter values adjusted by system controller 750 may relate to process conditions. Non-limiting examples include process gas composition and flow rates and dose times, temperature, pressure, plasma conditions (such as RF power levels), and variation of one or more parameter values across ALD cycles, etc. These parameter values may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameter values to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller. The controller 750 may have any of the features described above with respect to FIG. 6.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted comparing deposition uniformity for multi-cyclic ALD processes performed in accordance with disclosed embodiments. The apparatus used included two manifolds—Manifold 1 and Manifold 2. Manifold 1 delivered a carrier gas and may be diverted. Manifold 2 delivered a carrier gas along with a silicon-containing ALD precursor. The flow from Manifold 1 merged with Manifold 2 prior to delivery to the showerhead and into the process chamber where a substrate was housed. Five substrates were evaluated and underwent different carrier gas flows. Processes were performed at 50° C.

The first substrate involved repeating the following ALD cycle: Precursor dose with 9.5 slm carrier gas flow for 0.2 seconds, purge, 1000 W oxidizing plasma exposure, and purge.

The second substrate involved repeating the following ALD cycle: precursor dose with 6 slm carrier gas flow for 0.2 seconds, purge, 1000 W oxidizing plasma exposure, and purge.

The third substrate involved repeating the following ALD cycle: precursor dose with 3.5 slm carrier gas flow for 0.2 seconds, purge, 1000 W oxidizing plasma exposure, and purge.

The fourth substrate involved repeating the following multi-cyclic ALD process cycle: precursor dose with 6 slm carrier gas flow for 0.2 seconds, purge, 1000 W oxidizing plasma exposure, purge, precursor dose with 9.5 slm carrier gas flow for 0.2 seconds, purge, 1000 W oxidizing plasma exposure, purge.

The fifth substrate involved repeating the following multi-cyclic ALD process cycle: precursor dose with 3.5 slm carrier gas flow for 0.2 seconds, purge, 1000 W oxidizing plasma exposure, purge, precursor dose with 9.5 slm carrier gas flow for 0.2 seconds, purge, 1000 W oxidizing plasma exposure, purge.

Figure 8A:
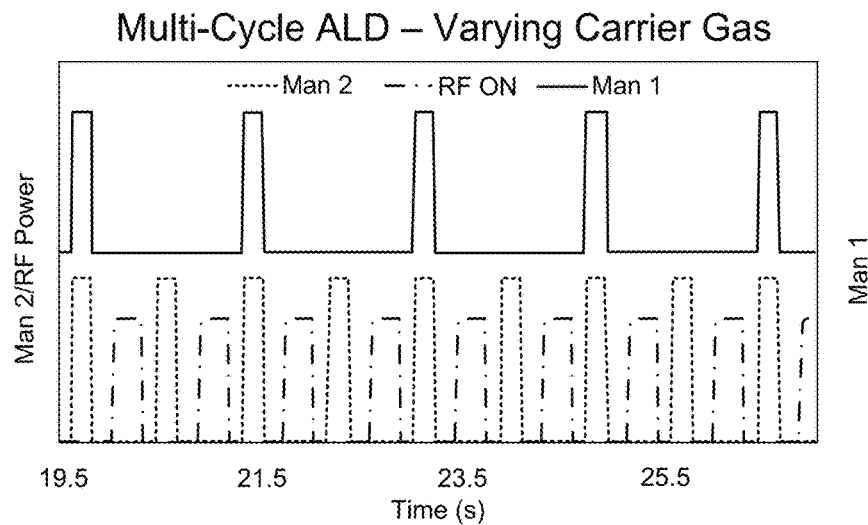
FIGS. 8A and 11 are graphs depicting pulsing and timing schemes corresponding to processes in experiments performing disclosed embodiments.

The timing diagram in FIG. 8A shows the flows of carrier gas and RF power. "RF ON" represents the timing for when the plasma was turned on. "Man 1" shows the timing when Manifold 1 was turned on. "Man 2" shows the timing when Manifold 2 was turned on—note it was flowed twice as frequently as Manifold 1. In the first, second, and third substrates, the timing corresponded to using Man 2 and RF ON (lower half of FIG. 8A). In the fourth and fifth substrates, the first cycle included only Manifold 2 carrier gas, while the second cycle included both Manifold 2 and Manifold 1, and such cycles were repeated such that the combination of the top and bottom halves of FIG. 8A were all conducted.

The thicknesses of material deposited on the substrates were determined using 49-point polar metrology, where thickness measurements were taken on various points (point 1 being the center, points 2-9 forming a first ring around point 1, points 10-25 forming a second ring around the first ring, and points 26-49 forming a third ring around the second ring, measured 3 mm from the edge of the wafer. Nonuniformity (NU %) was evaluated as was the deposition rate from mean thickness.

Figure 8B:
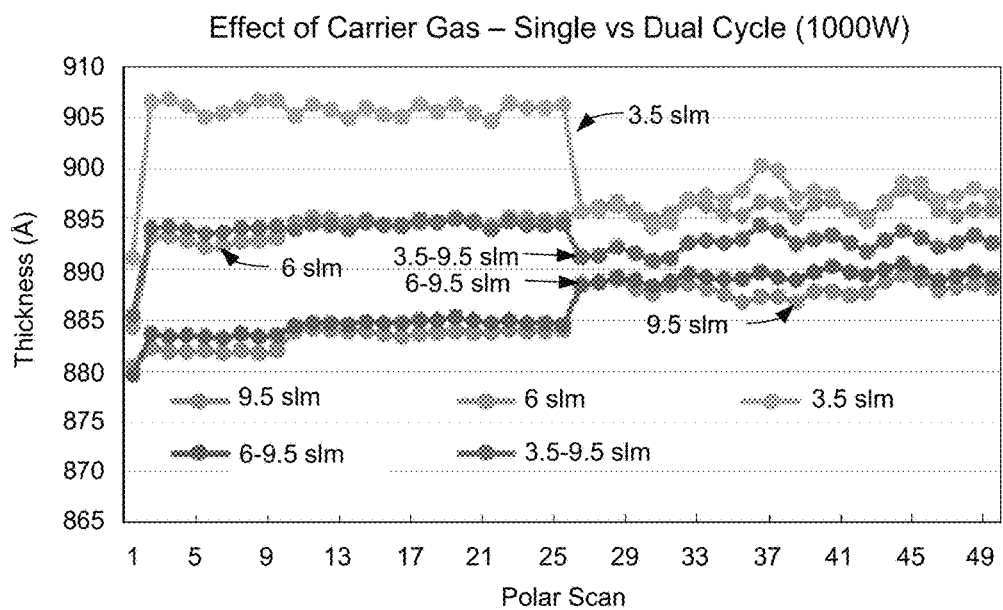
FIGS. 8B, 9A, 9B, 10A, 10B, and 12 are graphs depicting thickness of deposited films on wafers from experiments performed in accordance with disclosed embodiments.

The results for thickness are depicted in FIG. 8B and in Table 1 below. As shown in FIG. 8B, an edge thin profile for a single carrier gas is shown as the line labeled 3.5 slm, and an edge thick profile for a single carrier gas is shown as the line labeled 9.5 slm.

TABLE 1

1000 W Carrier Gas Flow Variation in Multi-cyclic ALD

| Process | RF Power | Carrier Gas Flow | Mean Thickness (Å) | NU % (R/2) |
|---|---|---|---|---|
| Single Carrier Gas ALD | 1000 W | 9.5 slm | 886 | 0.51 |
| Single Carrier Gas ALD | 1000 W | 6 slm | 895 | 0.76 |
| Single Carrier Gas ALD | 1000 W | 3.5 slm | 901 | 0.87 |

TABLE 1-continued

1000 W Carrier Gas Flow Variation in Multi-cyclic ALD

| Process | RF Power | Carrier Gas Flow | Mean Thickness (Å) | NU % (R/2) |
|---|---|---|---|---|
| Multi-cyclic ALD | 1000 W | 6 slm, 9.5 slm | 887 | 0.62 |
| Multi-cyclic ALD | 1000 W | 3.5 slm, 9.5 slm | 893 | 0.54 |

As shown, a multi-cyclic ALD process such as shown for the 6-9.5 slm and 3.5-9.5 slm wafers exhibited better NU %. Deposition rate was greater, likely due to the lower carrier gas flow and higher precursor partial pressure. The multi-cyclic processes were able to achieve both edge thick and edge thin profiles as shown in FIG. 8B.

Experiment 2

An experiment was conducted comparing deposition uniformity for multi-cyclic ALD processes performed in accordance with disclosed embodiments. Three substrates were evaluated and underwent different carrier gas flows. Processes were performed at 200° C.

The first substrate involved repeating the following ALD cycle: precursor dose with 9.5 slm carrier gas flow for 0.2 seconds, purge, 1500 W oxidizing plasma exposure, and purge.

The second substrate involved repeating the following multi-cyclic ALD process cycle: precursor dose with 6 slm carrier gas flow for 0.2 seconds, purge, 1500 W oxidizing plasma exposure, purge, and precursor dose with 9.5 slm carrier gas flow for 0.2 seconds, purge, 1500 W oxidizing plasma exposure, purge.

The third substrate involved repeating the following multi-cyclic ALD process cycle: precursor dose with 3.5 slm carrier gas flow for 0.2 seconds, purge, 1500 W oxidizing plasma exposure, purge, and precursor dose with 9.5 slm carrier gas flow for 0.2 seconds, purge, 1500 W oxidizing plasma exposure, purge.

The first substrate involved only one carrier gas flow (Manifold 2, referring to FIG. 8A for the timing diagram), while the second and third substrates each involved multi-cyclic ALD processes with two ALD cycles with different carrier gas flows (varying between Manifold 2 only and both Manifold 1 and 2, referring to FIG. 8A for the timing diagram).

Figure 9A:
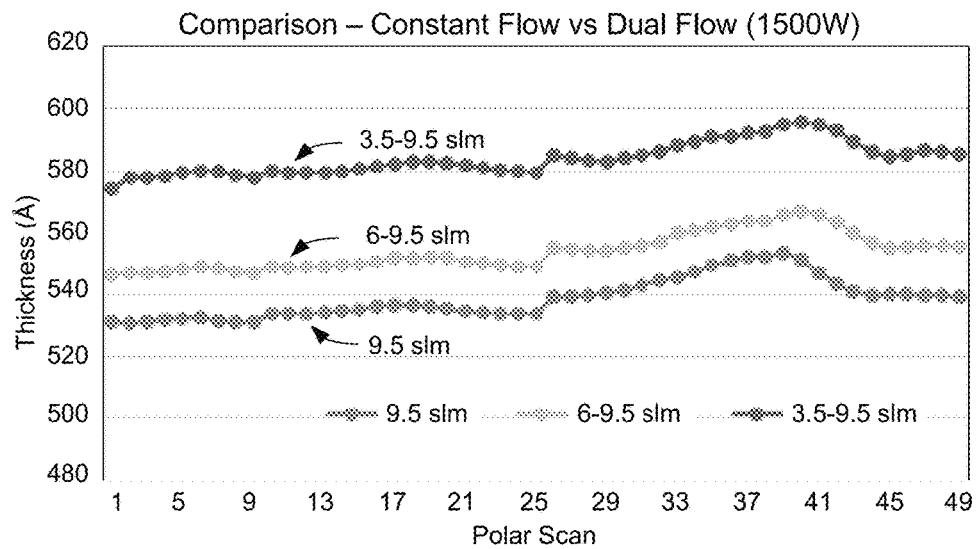

The thicknesses of material deposited on the substrates were determined using 49-point polar metrology. Nonuniformity (NU %) was evaluated as was the deposition rate (DepR) from mean thickness. The results for thickness are depicted in FIGS. 9A (thickness) and 9B (normalized thickness) and in Table 2 below.

TABLE 2

1500 W Carrier Gas Flow Variation in Multi-cyclic ALD

| Process | RF Power | Carrier Gas Flow | Mean Thickness (Å) | NU % (R/2) |
|---|---|---|---|---|
| Single Carrier Gas ALD | 1500 W | 9.5 slm | 539 | 2.10 |
| Multi-cyclic ALD | 1500 W | 6 slm, 9.5 slm | 554 | 1.86 |
| Multi-cyclic ALD | 1500 W | 3.5 slm, 9.5 slm | 584 | 1.84 |

Figure 9B:
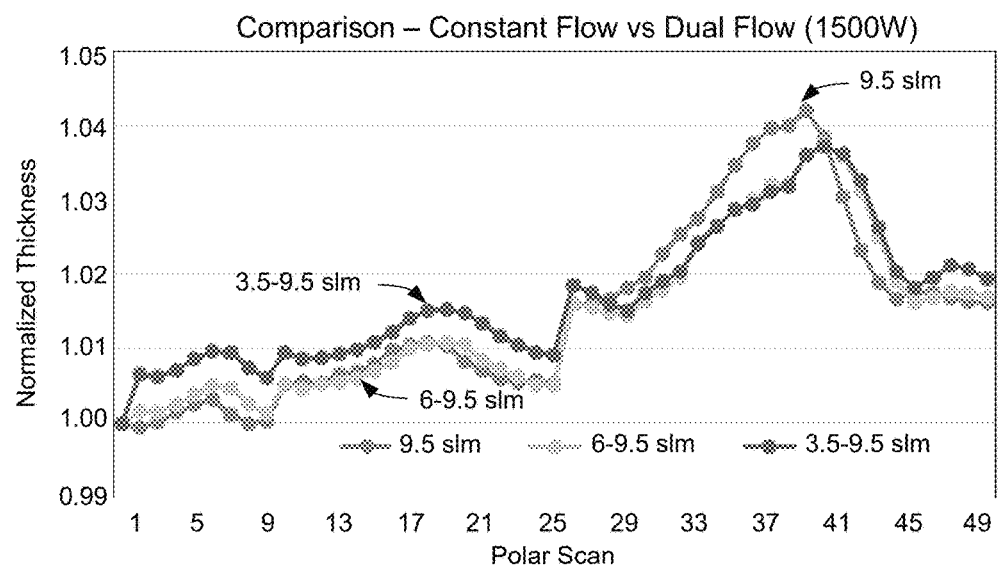

As shown, a multi-cyclic ALD process such as shown for the 3.5-9.5 slm and the 6-9.5 slm wafers exhibited better NU %. Deposition rate was greater, likely due to the lower carrier gas flow and resulting higher precursor partial pressure. Both FIGS. 9A and 9B show the improved uniformity in the multi-cyclic ALD processes.

Experiment 3

An experiment was conducted comparing deposition uniformity for multi-cyclic ALD processes performed in accordance with disclosed embodiments. Five substrates were evaluated and underwent different carrier gas flows. Processes were performed at 200° C.

The first substrate involved repeating the following ALD cycle: precursor dose with 9.5 slm carrier gas flow for 0.2 seconds, purge, 2500 W oxidizing plasma exposure, and purge.

The second substrate involved repeating the following ALD cycle: precursor dose with 6 slm carrier gas flow for 0.2 seconds, purge, 2500 W oxidizing plasma exposure, and purge.

The third substrate involved repeating the following ALD cycle: precursor dose with 3.5 slm carrier gas flow for 0.2 seconds, purge, 2500 W oxidizing plasma exposure, and purge.

The fourth substrate involved repeating the following multi-cyclic ALD process cycle: precursor dose with 6 slm carrier gas flow for 0.2 seconds, purge, 2500 W oxidizing plasma exposure, purge, and precursor dose with 9.5 slm carrier gas flow for 0.2 seconds, purge, 2500 W oxidizing plasma exposure, purge.

The fifth substrate involved repeating the following multi-cyclic ALD process cycle: precursor dose with 3.5 slm carrier gas flow for 0.2 seconds, purge, 2500 W oxidizing plasma exposure, purge, and precursor dose with 9.5 slm carrier gas flow for 0.2 seconds, purge, 2500 W oxidizing plasma exposure, purge.

Like Experiment 1, the first, second, and third substrates used only Manifold 2. The fourth and fifth substrates varied between using Manifold 2 and using both Manifold 1 and 2 between cycles.

Figure 10A:
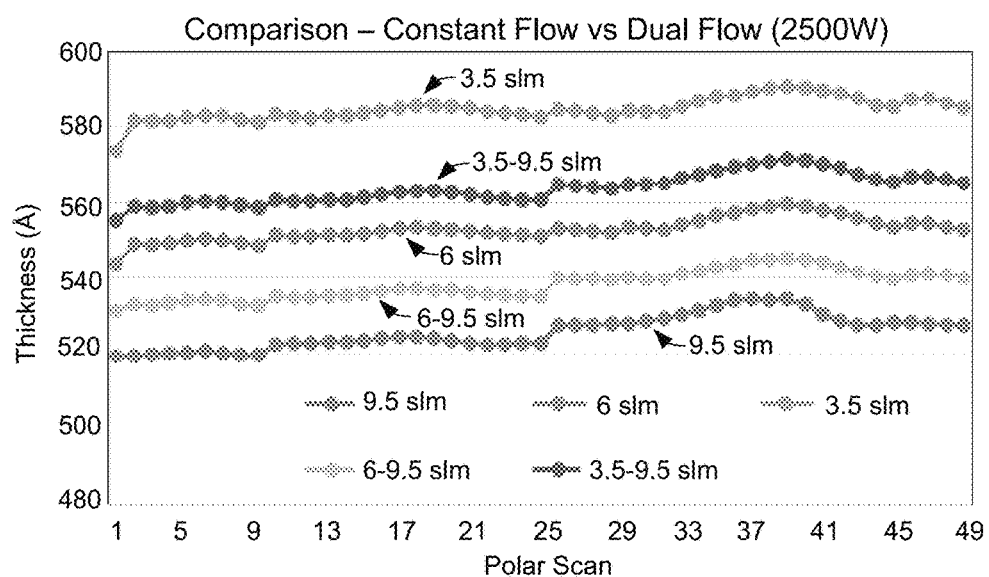

The thicknesses of material deposited on the substrates were determined using 49-point polar metrology. Nonuniformity (NU %) was evaluated as was the deposition rate (DepR) from mean thickness. The results for thickness are depicted in FIGS. 10A (thickness) and 10B (normalized thickness) and in Table 3 below.

TABLE 3

2500 W Carrier Gas Flow Variation in Multi-cyclic ALD

| Process | RF Power | Carrier Gas Flow | Mean Thickness (Å) | NU % (R/2) |
|---|---|---|---|---|
| Single Carrier Gas ALD | 2500 W | 9.5 slm | 526 | 1.46 |
| Single Carrier Gas ALD | 2500 W | 6 slm | 553 | 1.40 |
| Single Carrier Gas ALD | 2500 W | 3.5 slm | 585 | 1.47 |
| Multi-cyclic ALD | 2500 W | 6 slm, 3.5 slm | 538 | 1.30 |
| Multi-cyclic ALD | 2500 W | 3.5 slm, 6 slm | 563 | 1.46 |

Figure 10B:
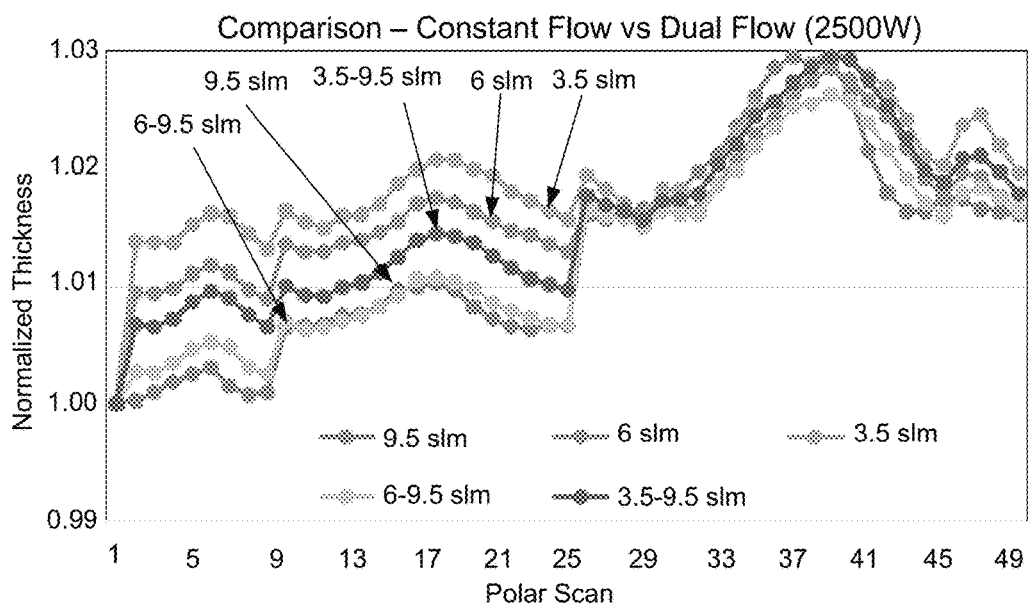

As shown, a multi-cyclic ALD process such as shown for the multi-cyclic ALD wafers exhibited better NU %. Deposition rate was correlated to carrier gas flow; lower carrier gas flow gave higher deposition rate. Both FIGS. 10A and 10B show the improved uniformity in the multi-cyclic ALD processes.

Experiment 4

An experiment was conducted regarding deposition uniformity for multi-cyclic ALD processes performed in accordance with disclosed embodiments. Two substrates were exposed to single cycle ALD processes. Two substrates were exposed to multi-cyclic ALD processes with varying dose times with 1000 W plasma power. Processes were performed at 50° C.

The first substrate involved repeating the following ALD cycle: precursor dose for 0.2 seconds, purge, 1000 W oxidizing plasma exposure, and purge.

The second substrate involved repeating the following ALD cycle: precursor dose for 0.1 seconds, purge, 1000 W oxidizing plasma exposure, and purge.

The third substrate involved repeating the following multi-cyclic ALD process cycle: precursor dose for 0.1 seconds, purge, 1000 W oxidizing plasma exposure, purge, precursor dose for 0.2 seconds, purge, 1000 W oxidizing plasma exposure, and purge.

The fourth substrate involved repeating the following multi-cyclic ALD process cycle: precursor dose for 0.2 seconds, purge, 1000 W oxidizing plasma exposure, purge, precursor dose for 0.3 seconds, purge, 1000 W oxidizing plasma exposure, and purge.

Figure 11:
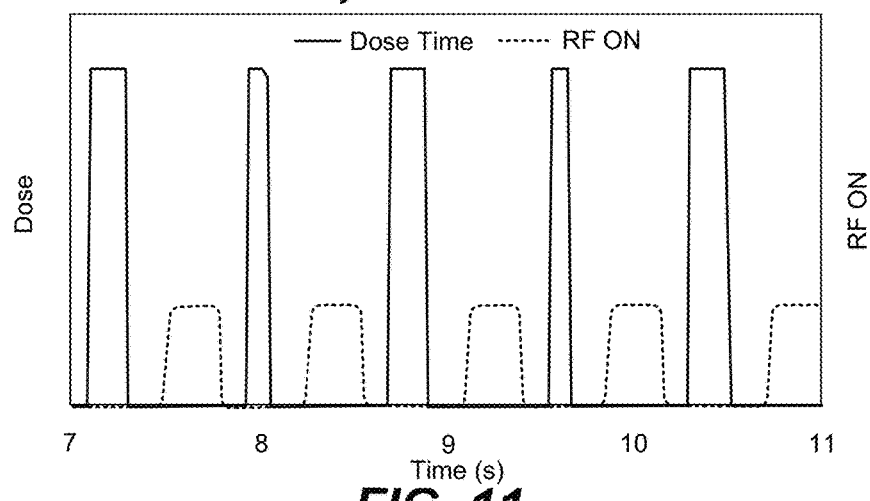

FIG. 11 shows an example of the dose time timing for a multi-cyclic ALD cycle used in this experiment. Note that the RF on duration is the same every cycle, whereas the dose time duration varies between long dose time and short dose time.

Figure 12:
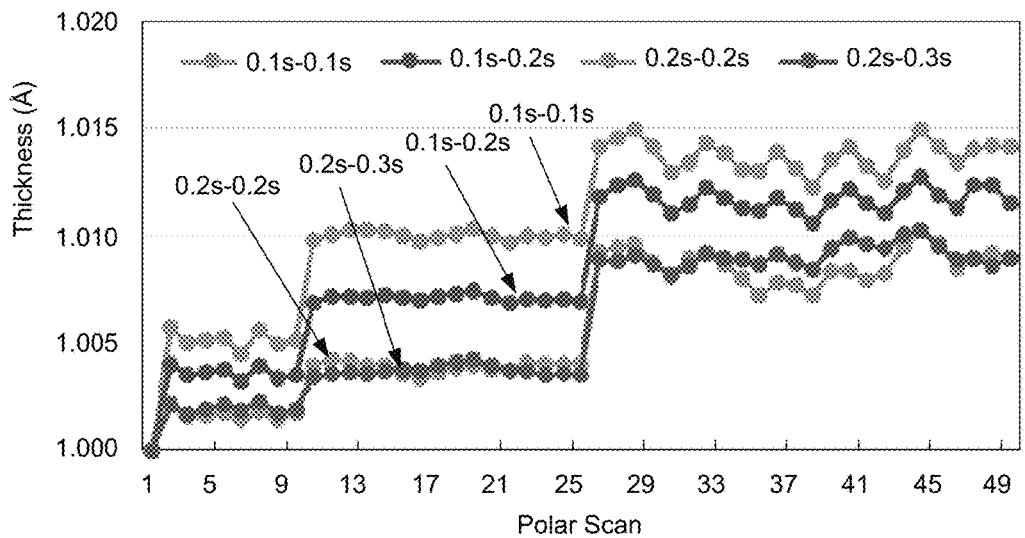

The thicknesses of material deposited on the substrates were determined using 49-point polar metrology. Nonuniformity (NU %) was evaluated as was the mean thickness. The results for thickness are depicted in FIG. 12 and in Table 4 below.

TABLE 4

Dose Time Variation in Multi-cyclic ALD at 1000 W and 50° C.

| Process | Dose Time | Mean Thickness (Å) | NU % (R/2) |
|---|---|---|---|
| Single Cycle ALD | 0.2 sec | 886 | 0.51 |
| Single Cycle ALD | 0.1 sec | 847 | 0.74 |
| Multi-cyclic ALD | 0.1 sec, 0.2 sec | 865 | 0.63 |
| Multi-cyclic ALD | 0.2 sec, 0.3 sec | 894 | 0.51 |

The results show an improvement in uniformity with increase in average dose time e.g. 0.1 s dose time showed 0.74% NU whereas 0.15 s dose time (average of 0.1 and 0.2 s) showed a NU % of 0.63. It also shows that NU % stabilizes around average dose time of 0.2 s. FIG. 12 shows thickness profile of difference processes. The thickness at the edge relative to center decreases with increased dose time. These results suggest that multi-cyclic ALD can be used to tune the thickness profile.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a semiconductor wafer housed in a chamber, the method comprising:
   (a) exposing the semiconductor wafer having a plurality of features to a reactant for a duration insufficient to saturate a surface of the semiconductor wafer, wherein exposing the semiconductor wafer to the reactant further comprises flowing one or more inert carrier gases;
   (b) exposing the semiconductor wafer to a plasma to deposit at least a partial layer of a film on the semiconductor wafer; and
   (c) repeating (a) and (b) in two or more deposition cycles in alternating pulses to deposit the film on the semiconductor wafer,
   wherein flow rates of at least one of the one or more inert carrier gases during (a) are varied during the two or more deposition cycles from deposition cycle to deposition cycle to tune thickness profile of the deposited film as being an edge thin or edge thick profile as characterized by measurements of thickness at the edge of the semiconductor wafer using polar metrology as measured over the surface of the semiconductor wafer to determine the thickness profile of the film.

2. The method of claim 1, wherein exposing the semiconductor wafer to the plasma in (b) further comprises exposing the semiconductor wafer to a second reactant.

3. The method of claim 2, wherein composition of the second reactant is varied during the two or more deposition cycles from deposition cycle to deposition cycle.

4. The method of claim 1, further comprising (d) purging the chamber after at least one of (a) or (b) during one or more of the two or more deposition cycles.

5. The method of claim 4, wherein purging the chamber comprises flowing a purge gas.

6. The method of claim 5, wherein composition of the purge gas in (d) is varied during the two or more deposition cycles from deposition cycle to deposition cycle.

7. The method of claim 4, wherein duration of (d) is varied during the two or more deposition cycles from deposition cycle to deposition cycle.

8. The method of claim 1, wherein the duration of (a) is between about 0.05 seconds and about 5 seconds.

9. The method of claim 1, wherein plasma power during (b) is between about 50 W and about 6000 W.

* * * * *